United States Patent
Iwao et al.

(10) Patent No.: US 10,861,717 B2
(45) Date of Patent: Dec. 8, 2020

(54) SUBSTRATE PROCESSING APPARATUS, PROCESSING LIQUID DRAINING METHOD, PROCESSING LIQUID REPLACING METHOD, AND SUBSTRATE PROCESSING METHOD

(71) Applicant: SCREEN Holdings Co., Ltd., Kyoto (JP)

(72) Inventors: Michinori Iwao, Kyoto (JP); Noriyuki Kikumoto, Kyoto (JP); Shuichi Yasuda, Kyoto (JP)

(73) Assignee: SCREEN Holdings Co., Ltd.

( * ) Notice: Subject to any disclaimer, the term of this patent is extended or adjusted under 35 U.S.C. 154(b) by 130 days.

(21) Appl. No.: 16/261,641

(22) Filed: Jan. 30, 2019

(65) Prior Publication Data

US 2019/0267260 A1 Aug. 29, 2019

(30) Foreign Application Priority Data

Feb. 28, 2018 (JP) .................... 2018-035511

(51) Int. Cl.
| | |
|---|---|
| *F16K 31/02* | (2006.01) |
| *H01L 21/67* | (2006.01) |
| *G05D 7/06* | (2006.01) |
| *H01L 21/00* | (2006.01) |
| *G05D 9/12* | (2006.01) |

(52) U.S. Cl.
CPC ..... *H01L 21/67023* (2013.01); *G05D 7/0635* (2013.01); *H01L 21/00* (2013.01); *H01L 21/67017* (2013.01); *H01L 21/67051* (2013.01); *G05D 9/12* (2013.01)

(58) Field of Classification Search
CPC ............... H01L 21/67023; H01L 21/00; H01L 21/67017; H01L 21/67051; G05D 7/0635; G05D 9/12
USPC ....... 137/487.5; 156/345.11, 345.18, 345.29, 156/345.33, 389
See application file for complete search history.

(56) References Cited

U.S. PATENT DOCUMENTS

| | | | |
|---|---|---|---|
| 8,261,762 B2 * | 9/2012 | Komiyama | ............... F17C 5/06 137/15.04 |
| 2005/0067021 A1 * | 3/2005 | Bevers | ................. G05D 7/0658 137/487.5 |

(Continued)

FOREIGN PATENT DOCUMENTS

| | | |
|---|---|---|
| JP | 2004-158482 A | 6/2004 |
| JP | 2015-173285 A | 10/2015 |

*Primary Examiner* — Minh Q Le
(74) *Attorney, Agent, or Firm* — Ostrolenk Faber LLP

(57) ABSTRACT

A substrate processing apparatus includes a processing liquid supply nozzle to supply a processing liquid to a substrate, a storage portion that stores the processing liquid supplied, a liquid-sending pipe that sends the processing liquid stored in the storage portion to the nozzle, a flow pipe that allows a processing liquid to flow therethrough, an oxygen concentration meter interposed in the flow pipe, a hypoxic fluid supply pipe that is in communication with the flow pipe and that sends a hypoxic fluid to the flow pipe, and a flow rate changing valve interposed in the hypoxic fluid supply pipe. A flow-rate-changing controller controls the flow rate changing valve so that the hypoxic fluid is supplied to the flow pipe until an inside of the flow pipe is filled with the hypoxic fluid when the processing liquid inside the flow pipe is drained.

18 Claims, 6 Drawing Sheets

(56) References Cited

U.S. PATENT DOCUMENTS

| | | | |
|---|---|---|---|
| 2007/0071439 A1* | 3/2007 | Kaneyama | H01L 21/67051 396/611 |
| 2007/0175392 A1* | 8/2007 | Znamensky | C23C 16/54 118/715 |
| 2009/0229641 A1* | 9/2009 | Yoshida | B08B 3/14 134/107 |
| 2010/0247761 A1* | 9/2010 | Hashimoto | H01L 21/67051 427/240 |
| 2011/0000554 A1* | 1/2011 | Hattori | C23C 16/4482 137/487.5 |
| 2012/0304930 A1* | 12/2012 | Verdict | C23C 16/4412 118/715 |
| 2013/0220478 A1 | 8/2013 | Kasahara et al. | 141/2 |
| 2013/0233357 A1* | 9/2013 | Minamihonoki | B08B 7/00 134/34 |
| 2013/0306238 A1 | 11/2013 | Miura et al. | 156/345.11 |
| 2016/0086810 A1* | 3/2016 | Fujiwara | H01L 21/6704 438/748 |
| 2016/0233082 A1* | 8/2016 | Yano | H01L 21/67086 |
| 2017/0221731 A1* | 8/2017 | Tanaka | C03C 17/30 |
| 2018/0371611 A1* | 12/2018 | Sato | C23C 16/4412 |
| 2019/0139756 A1* | 5/2019 | Yamaguchi | H01L 21/6715 |
| 2019/0262851 A1* | 8/2019 | Iwao | H01L 21/02052 |

\* cited by examiner

SUBSTRATE PROCESSING APPARATUS, PROCESSING LIQUID DRAINING METHOD, PROCESSING LIQUID REPLACING METHOD, AND SUBSTRATE PROCESSING METHOD

CROSS REFERENCE TO RELATED APPLICATIONS

This application claims priority based on Japanese Patent Application No. 2018-35511 filed on Feb. 28, 2018, the entire contents of which are incorporated herein by reference.

BACKGROUND OF THE INVENTION

1. Field of the Invention

The present invention relates to a substrate processing apparatus and a substrate processing method that processes a substrate. Additionally, the present invention relates to a processing liquid draining method and a processing liquid replacing method in the substrate processing apparatus. Examples of substrates to be processed include semiconductor wafers, substrates for FPDs (Flat Panel Displays) such as liquid crystal displays, plasma displays, FEDs (Field Emission Displays), or organic EL (Electroluminescence) displays, substrates for optical disks, substrates for magnetic disks, substrates for magneto-optical disks, substrates for photomasks, ceramic substrates, and substrates for solar cells.

2. Description of the Related Art

As the degree of integration and the operation speed of semiconductor integrated circuit devices become higher, copper wiring that is even lower in resistance has been used in a BEOL (Back end of line) in the formation of semiconductor devices. Additionally, a group III-V material or a Ge-based material has been used as a multilayer-film material in an FEOL (Front end of line). Appropriate treatment is applied to the wiring and multilayer films of these materials to prevent deterioration thereof and realize an integrated circuit device that operates at a high speed.

Japanese Patent Application Publication Nos. 2004-158482 and 2015-173285 disclose a process in which a processing liquid, such as a chemical solution or pure water, whose oxygen concentration has been sufficiently reduced is supplied to a substrate. This process makes it possible to prevent copper wiring from being deteriorated by oxidation, to prevent the aforementioned multilayer film material from being oxidized, and to prevent a needless oxide film from being formed in interfaces between multilayer films.

In order to supply a substrate with a processing liquid whose oxygen concentration has been sufficiently reduced, there is a need to beforehand prepare a processing liquid whose oxygen concentration is low and then measure whether the oxygen concentration of the processing liquid has been reduced to a predetermined oxygen concentration by use of an oxygen concentration meter. US2016/0233082A1 discloses that the oxygen concentration of a processing liquid is measured by an oxygen concentration meter interposed in a pipe that branches from a processing-liquid supply pipe through which a processing liquid is supplied.

SUMMARY OF THE INVENTION

If the oxygen concentration meter is exposed to a gas that includes highly-concentrated oxygen when a processing liquid is drained from the pipe in which the oxygen concentration meter is placed, time will be required until the oxygen concentration meter fulfills a proper function. Therefore, a long period of time will be required until it becomes possible to actually perform substrate processing, and therefore the substrate processing efficiency will be lowered.

Therefore, one object of the present invention is to provide a substrate processing apparatus and a substrate processing method that are capable of performing substrate processing without lowering the substrate processing efficiency while preventing an oxygen concentration meter from being exposed to a gas, such as atmospheric air, that includes highly-concentrated oxygen. Another object of the present invention is to provide a processing liquid draining method and a processing liquid replacing method that are performed while preventing an oxygen concentration meter from being exposed to a gas, such as atmospheric air, that includes highly-concentrated oxygen.

One preferred embodiment of the present invention provides a substrate processing apparatus that processes a substrate. The substrate processing apparatus includes a processing portion that has a processing liquid supply nozzle and that supplies a processing liquid from the processing liquid supply nozzle to a substrate to process the substrate, a storage portion that stores the processing liquid supplied from a processing liquid supply source, a liquid-sending pipe that sends the processing liquid stored in the storage portion to the processing liquid supply nozzle, a flow pipe that forms a flow passage different from the liquid-sending pipe and that allows a processing liquid to flow through the flow passage, an oxygen concentration meter that is interposed in the flow pipe and that measures a concentration of oxygen dissolved in a processing liquid flowing through the flow pipe, a hypoxic fluid supply pipe that is in communication with the flow pipe and that sends a hypoxic fluid supplied from a hypoxic fluid supply source to the flow pipe, a flow rate changing valve that is interposed in the hypoxic fluid supply pipe and that changes a supply flow rate of the hypoxic fluid to the flow pipe, and a controller. The controller has a flow-rate-changing controller that controls the flow rate changing valve so that the hypoxic fluid is supplied to the flow pipe until at least an inside of the flow pipe is filled with the hypoxic fluid when the processing liquid inside the flow pipe is drained.

Specifically, the hypoxic fluid denotes a fluid denotes a fluid whose oxygen concentration is lower than atmospheric air. The hypoxic fluid may be a gas, such as inert gas, or may be a liquid, such as pure water.

In the substrate processing apparatus, when the processing liquid in the flow pipe is drained from the flow pipe, the inside of the flow pipe in which the oxygen concentration meter is interposed is filled with a hypoxic fluid. This makes it possible to prevent the oxygen concentration meter from being exposed to a fluid that contains highly-concentrated oxygen, such as atmospheric air, and therefore it is possible to prevent a deterioration in the function of the oxygen concentration meter. Therefore, it is possible to perform substrate processing without lowering processing efficiency.

In one preferred embodiment of the present invention, the substrate processing apparatus further includes a pump that is interposed in the flow pipe and that sends a processing liquid stored in the storage portion. The flow pipe forms a circulated path that circulates a processing liquid stored in the storage portion inside the flow pipe by flowingly connecting one end of the flow pipe to a sending opening that is provided in the storage portion and from which a processing liquid is sent and by flowingly connecting an opposite end of the flow pipe to a return opening that is provided in the storage portion and to which a processing liquid returns. The liquid-sending pipe branches from a position on a more downstream side of the flow pipe than a position at which the oxygen concentration meter is interposed, and is flowingly connected to the flow pipe, and sends the processing liquid that has been sent from the storage portion through the flow pipe to the processing liquid supply nozzle.

In one preferred embodiment of the present invention, the hypoxic fluid supply pipe has a hypoxic fluid supply port that is flowingly connected to the storage portion so that the hypoxic fluid supply port faces an inside of the storage portion, and the hypoxic fluid supply pipe is in communication with the flow pipe through the storage portion, and the hypoxic fluid supply pipe sends a hypoxic fluid supplied from the hypoxic fluid supply source to the flow pipe.

In one preferred embodiment of the present invention, the substrate processing apparatus further includes a drainage pipe that is flowingly connected to the storage portion and that drains the processing liquid stored in the storage portion and a drainage valve that is interposed in the drainage pipe and that opens and closes a flow passage of the drainage pipe. The controller includes a drainage valve controller that opens and closes the drainage valve and that controls switching between a state in which the processing liquid stored in the storage portion is drained from the storage portion and a state in which the processing liquid stored in the storage portion is not drained from the storage portion.

In one preferred embodiment of the present invention, the oxygen concentration meter is disposed in a bypass pipe that branches from the flow pipe.

In one preferred embodiment of the present invention, the substrate processing apparatus further includes a new liquid supply pipe that is flowingly connected to the storage portion and that supplies the processing liquid, which is new and which is supplied from the processing liquid supply source, to the storage portion and a new liquid supply valve that is interposed in the new liquid supply pipe and that opens and closes a flow passage of the new liquid supply pipe. The controller further includes a new liquid supply controller that opens and closes the new liquid supply valve and that controls switching between a supply state in which the new processing liquid supplied from the processing liquid supply source is supplied to the storage portion and a non-supply state in which the new processing liquid supplied from the processing liquid supply source is not supplied to the storage portion.

In one preferred embodiment of the present invention, the flow-rate-changing controller changes an open-closed state of the flow rate changing valve and increases a supply flow rate of a hypoxic fluid in a state in which the new processing liquid is being supplied from the processing liquid supply source to the storage portion.

In one preferred embodiment of the present invention, a supply port of the hypoxic fluid supply pipe is open inside a storage space of the storage portion, and the flow-rate-changing controller changes an open-closed state of the flow rate changing valve and increases a supply flow rate of a hypoxic fluid after a liquid surface of the new processing liquid stored in the storage portion becomes greater than a height of the supply port of the hypoxic fluid supply pipe.

In one preferred embodiment of the present invention, the substrate processing apparatus further includes a storage liquid supply pipe that sends a processing liquid stored in the storage portion to a downstream side and a flow passage switching valve to which a downstream side end of the storage liquid supply pipe, an upstream side end of the flow pipe, and an upstream side end of the liquid-sending pipe are flowingly connected. The controller includes a flow passage switching controller that controls the flow passage switching valve so that switching is performed between a flowing state in which the processing liquid flows through the flow pipe and a liquid-sending state in which the processing liquid is sent to the liquid-sending pipe.

In one preferred embodiment of the present invention, the hypoxic fluid supply pipe is flowingly connected to the flow pipe at a position on a more upstream side of the flow pipe than a position at which the oxygen concentration meter is interposed, and the flow-rate-changing controller further controls the flow rate changing valve so that the hypoxic fluid is sent from the hypoxic fluid supply pipe to the flow pipe when the processing liquid is not flowing through the flow pipe.

In one preferred embodiment of the present invention, the controller includes a flow passage switching controller that controllably switches the flow passage switching valve so that the processing liquid is sent to the liquid-sending pipe after the oxygen concentration meter detects that an oxygen concentration of the processing liquid is not more than a predetermined concentration in a flowing state in which the processing liquid is flowing through the flow pipe.

In one preferred embodiment of the present invention, when the flow passage switching controller has switched the flow passage switching valve so that a processing liquid is sent to the liquid-sending pipe, the flow-rate-changing controller controls the flow rate changing valve so that the hypoxic fluid is supplied to the flow pipe, and drains the processing liquid remaining in the flow pipe from the flow pipe.

Additionally, one preferred embodiment of the present invention provides a processing liquid draining method in a substrate processing apparatus. The substrate processing apparatus includes a processing portion that has a processing liquid supply nozzle and that supplies a processing liquid from the processing liquid supply nozzle to a substrate to process the substrate, a storage portion that stores the processing liquid supplied from a processing liquid supply source, a liquid-sending pipe that sends the processing liquid stored in the storage portion to the processing liquid supply nozzle, a flow pipe that forms a flow passage different from the liquid-sending pipe and that allows the processing liquid to flow through the flow passage, an oxygen concentration meter that is interposed in the flow pipe and that measures a concentration of oxygen dissolved in the processing liquid flowing through the flow pipe, and a hypoxic fluid supply pipe that is in communication with the flow pipe and that sends a hypoxic fluid supplied from a hypoxic fluid supply source to the flow pipe. The processing liquid draining method includes a hypoxic fluid supply step of sending a hypoxic fluid supplied from the hypoxic fluid supply source from the hypoxic fluid supply pipe to the flow pipe and a processing liquid drainage step of draining the processing liquid remaining in the flow pipe from the flow pipe by use of the hypoxic fluid.

In the processing liquid draining method, the processing liquid remaining in the flow pipe is drained from the flow pipe, and also an inside of the flow pipe is replaced with a hypoxic fluid by use of the hypoxic fluid. This makes it possible to prevent the oxygen concentration meter interposed in the flow pipe from being exposed to a fluid that contains highly-concentrated oxygen, such as atmospheric air.

In one preferred embodiment of the present invention, the flow pipe forms a circulated path that circulates a processing liquid stored in the storage portion inside the flow pipe by flowingly connecting one end of the flow pipe to a sending opening that is provided in the storage portion and from which a processing liquid is sent and by flowingly connecting an opposite end of the flow pipe to a return opening that is provided in the storage portion and to which a processing liquid returns. The processing liquid draining method further includes a hypoxic fluid maintaining step of supplying a hypoxic fluid sent from the hypoxic fluid supply source to the storage portion and to the inside of the flow pipe after the processing liquid drainage step and maintaining a hypoxic state by filling the storage portion and the inside of the flow pipe with the hypoxic fluid.

In one preferred embodiment of the present invention, the substrate processing apparatus further includes a storage liquid supply pipe that sends the processing liquid stored in the storage portion to a downstream side and a flow passage switching valve to which a downstream side end of the storage liquid supply pipe, an upstream side end of the flow pipe, and an upstream side end of the liquid-sending pipe are flowingly connected. The hypoxic fluid supply pipe is flowingly connected to the flow pipe at a position on a more upstream side of the flow pipe than a position at which the oxygen concentration meter is interposed. The processing liquid draining method further includes a hypoxic fluid maintaining step of supplying a hypoxic fluid sent from the hypoxic fluid supply source to the hypoxic fluid supply pipe and to the flow pipe after the processing liquid drainage step and maintaining a hypoxic state by filling the hypoxic fluid supply pipe and the inside of the flow pipe with the hypoxic fluid.

Additionally, one preferred embodiment of the present invention provides a processing liquid replacing method in a substrate processing apparatus. The substrate processing apparatus includes a processing portion that has a processing liquid supply nozzle and that supplies a processing liquid from the processing liquid supply nozzle to a substrate to process the substrate, a storage portion that stores the processing liquid supplied from a processing liquid supply source, a liquid-sending pipe that sends the processing liquid stored in the storage portion to the processing liquid supply nozzle, a flow pipe that forms a flow passage different from the liquid-sending pipe and that allows the processing liquid to flow through the flow passage, an oxygen concentration meter that is interposed in the flow pipe and that measures a concentration of oxygen dissolved in the processing liquid flowing through the flow pipe, a hypoxic fluid supply pipe that is in communication with the flow pipe and that sends a hypoxic fluid supplied from a hypoxic fluid supply source to the flow pipe, and a drainage pipe that is flowingly connected to the storage portion and that drains the processing liquid stored in the storage portion. The processing liquid replacing method includes a drainage step of draining a processing liquid stored in the storage portion from the storage portion, a hypoxic fluid supply step of, after starting the drainage step, sending a hypoxic fluid supplied from the hypoxic fluid supply source from the hypoxic fluid supply pipe to the flow pipe in a state in which the processing liquid remains in the storage portion, a processing liquid drainage step of draining the processing liquid remaining in the flow pipe from the flow pipe while filling an inside of the storage portion and an inside of the flow pipe with a hypoxic fluid by use of the hypoxic fluid, and a new liquid supply step of, after the processing liquid drainage step, supplying a new processing liquid supplied from the processing liquid supply source to the storage portion and to the flow pipe in a state in which the inside of the storage portion and the inside of the flow pipe are filled with a hypoxic fluid.

In the processing liquid replacing method, it is possible to replace the processing liquid stored in the storage portion with a new processing liquid while filling the inside of the storage portion and the inside of the flow pipe with a hypoxic fluid. Therefore, in processing-liquid replacement, it is possible to replace the processing liquid while preventing the oxygen concentration meter from being exposed to a fluid that contains highly-concentrated oxygen, such as atmospheric air.

In one preferred embodiment of the present invention, the processing liquid replacing method further includes a hypoxic-fluid-flow-rate increasing step of increasing a supply flow rate of the hypoxic fluid after a liquid surface of the processing liquid in the new liquid supply step becomes greater than a height of a supply port of the hypoxic fluid supply pipe flowingly connected so as to face the inside of the storage portion.

Additionally, one preferred embodiment of the present invention provides a substrate processing method in a substrate processing apparatus. The substrate processing apparatus includes a processing portion that has a processing liquid supply nozzle and that supplies a processing liquid from the processing liquid supply nozzle to a substrate to process the substrate, a storage portion that stores the processing liquid supplied from a processing liquid supply source, a liquid-sending pipe that sends the processing liquid stored in the storage portion to the processing liquid supply nozzle, a flow pipe that forms a flow passage different from the liquid-sending pipe and that allows the processing liquid to flow through the flow passage, an oxygen concentration meter that is interposed in the flow pipe and that measures a concentration of oxygen dissolved in the processing liquid flowing through the flow pipe, a hypoxic fluid supply pipe that is in communication with the flow pipe and that sends a hypoxic fluid supplied from a hypoxic fluid supply source to the flow pipe, a flow rate changing valve that is interposed in the hypoxic fluid supply pipe and that changes a supply flow rate of the hypoxic fluid to the flow pipe, a storage liquid supply pipe that sends a processing liquid stored in the storage portion to a downstream side, and a flow passage switching valve to which a downstream side end of the storage liquid supply pipe, an upstream side end of the flow pipe, and an upstream side end of the liquid-sending pipe are flowingly connected. The hypoxic fluid supply pipe is flowingly connected to the flow pipe at a position on a more upstream side of the flow pipe than a position at which the oxygen concentration meter is interposed. The substrate processing method includes a processing liquid flowing step of switching the flow passage switching valve to cause the processing liquid to flow through the flow pipe, an oxygen concentration measurement step of measuring an oxygen concentration of the processing liquid flowing through the flow pipe by the oxygen concentration meter, a processing liquid sending step of sending the processing liquid to the liquid-sending pipe by switching the flow passage switching valve and sending the processing liquid to the processing supply nozzle when an oxygen concentration of the processing liquid of the flow pipe is not more than a predetermined concentration in the oxygen concentration measurement step, and a hypoxic fluid supply step of supplying the hypoxic fluid from the hypoxic fluid supply pipe to the flow pipe by increasing an opening degree of the flow rate changing valve so as to fill an inside of the flow pipe with a hypoxic fluid. The hypoxic fluid supplying step is performed in parallel with the processing liquid sending step.

In the substrate processing method, also when a processing liquid is sent to the liquid-sending pipe and is discharged from the processing liquid supply nozzle to a substrate, it is possible to fill the inside of the flow pipe with a hypoxic fluid supplied to the flow pipe in which the oxygen concentration meter is interposed. This makes it possible to prevent the oxygen concentration meter interposed in the flow pipe from being exposed to a fluid that contains highly-concentrated oxygen, such as atmospheric air.

The aforementioned or other objects, features, and effects of the present invention will be clarified by the following description of preferred embodiments given below with reference to the accompanying drawings.

DETAILED DESCRIPTION OF THE PREFERRED EMBODIMENTS

A description will be hereinafter given of a substrate processing apparatus, a substrate processing method, a processing liquid draining method, and a processing liquid replacing method according to a preferred embodiment of the present invention with reference to the drawings.

1. Substrate Processing Apparatus (First Preferred Embodiment)

Figure 1:
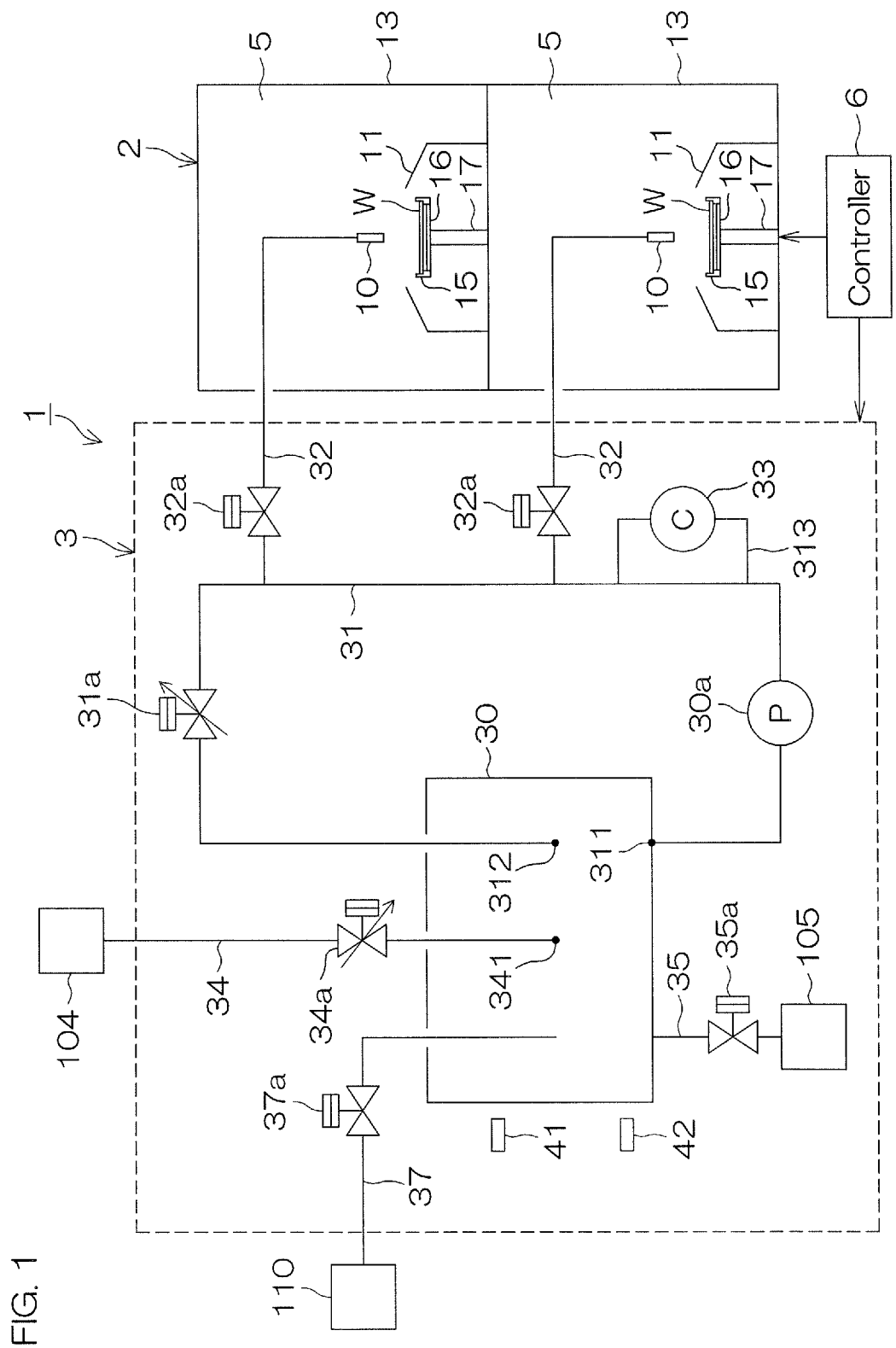
FIG. 1 is a schematic view showing a configuration of a substrate processing apparatus according to a first preferred embodiment of the present invention.

FIG. 1 is a schematic view showing a configuration of a substrate processing apparatus according to a first preferred embodiment of the present invention. In FIG. 1, the substrate processing apparatus 1 is a rotary type substrate processing apparatus, and is a single-substrate processing type apparatus that processes disk-shaped substrates W one by one.

In FIG. 1, the substrate processing apparatus 1 includes a processing tower 2 consisting of a plurality of stacked processing units 5, a processing liquid supply portion 3 that supplies a processing liquid to the processing units 5, and a controller 6 that controls the processing units 5 and the processing liquid supply portion 3.

Examples of processing liquids for use in the substrate processing apparatus include a chemical solution, a rinse liquid, and an organic solvent. The chemical solution is, for example, hydrofluoric acid (hydrogen fluoride water: HF). The rinse liquid is, for example, deionized water (DIW). The organic solvent is, for example, IPA (isopropyl alcohol).

In the following paragraphs, the term "processing liquid" is used as a broader term including the aforementioned chemical solution, the aforementioned rinse liquid, and the aforementioned organic solvent.

The processing unit 5 includes a spin chuck 15, a cup 11, a processing liquid supply nozzle 10, and a processing chamber 13. The spin chuck 15 rotates a substrate W while holding the substrate W in a horizontal posture. The cup 11 surrounds the spin chuck 15, and receives a processing liquid scattered from the substrate W. The processing liquid supply nozzle 10 supplies a processing liquid to an upper surface of the substrate W being rotated. The processing chamber 13 contains the spin chuck 15, the cup 11, and the processing liquid supply nozzle 10. The spin chuck 15 includes a spin base 16, a rotational portion 17, and an electric motor (not shown) that rotates the rotational portion 17.

The processing liquid supply portion 3 includes a storage portion 30 that stores a processing liquid, a new liquid supply pipe 37 that supplies a processing liquid from a processing liquid supply source 110 to the storage portion 30, a flow pipe 31 that allows a processing liquid stored in the storage portion 30 to flow therethrough, a liquid-sending pipe 32 that sends a processing liquid to the processing liquid supply nozzle 10, a hypoxic fluid supply pipe 34 that is in communication with the flow pipe 31 through the storage portion 30 and that supplies a hypoxic fluid from a hypoxic fluid supply source 104 to the storage portion 30, and a drainage pipe 35 that drains a processing liquid stored in the storage portion 30.

One end of the new liquid supply pipe 37 is connected to the processing liquid supply source 110, and the other end thereof is connected to the storage portion 30 in communication therewith. A processing liquid supplied from the processing liquid supply source 110 is supplied to the storage portion 30 through the new liquid supply pipe 37.

A new liquid supply valve 37a is interposed in the new liquid supply pipe 37. The new liquid supply valve 37a opens and closes a flow passage to perform switching between a supply state in which a processing liquid is supplied to the storage portion 30 and a supply stop state in which the supply of a processing liquid is stopped. A metallic filter and a particle filter (not shown) are also interposed in the new liquid supply pipe 37. A processing liquid supplied from the processing liquid supply source 110 is supplied to the storage portion 30 after metal ions or foreign substances are removed by the metallic filter and the particle filter.

At least a fixed-amount liquid surface sensor 41 that ascertains that a predetermined amount of processing liquid has been stored in the storage portion 30 and a lower-limit liquid surface sensor 42 that ascertains that a processing liquid stored in the storage portion 30 is in a state of a lower-limit amount are provided at the storage portion 30.

The flow pipe 31 is disposed so that a return opening 312 that is an opening formed in an end of the flow pipe 31 faces the inside of the storage portion 30. The other end of the flow pipe 31 is flowingly connected to a sending opening 311 that is disposed at the storage portion 30 and that sends a processing liquid. The return opening 312 is disposed so as to reach a state in which, when a predetermined amount of processing liquid is stored in the storage portion 30, the return opening 312 is immersed in the processing liquid.

A pump 30a is interposed in the flow pipe 31. The pump 30a performs a processing liquid sending operation so that a processing liquid stored in the storage portion 30 flows from the sending opening 311 of the storage portion 30 to the return opening 312 of the flow pipe 31 in the flow pipe 31. The flow pipe 31 forms a circulated path so that a processing liquid stored in the storage portion 30 goes out of the sending opening 311 of the storage portion 30 and returns to the storage portion 30. The flow pipe 31 forms a processing-liquid flow passage different from the liquid-sending pipe 32.

Additionally, a bypass pipe 313 that is flowingly connected so as to branch from the flow pipe 31 and be again joined together is disposed at the flow pipe 31 at a position on a more downstream side than a position at which the pump 30a is placed. The bypass pipe 313 is a part of the flow pipe 31. An oxygen concentration meter 33 that measures the oxygen concentration of a processing liquid is interposed in the bypass pipe 313. The oxygen concentration meter 33 measures the oxygen concentration of a processing liquid that has flowed into the bypass pipe 313 from the flow pipe 31. The bypass pipe 313 divides a processing liquid from the circulated path formed by the flow pipe 31, and rectifies its flow. As a result, it is possible to improve the measurement accuracy of the oxygen concentration meter 33.

The liquid-sending pipe 32 branches from the flow pipe 31 and is flowingly connected to the flow pipe 31 at a position on a more downstream side than a position at which the bypass pipe 313 in which the oxygen concentration meter 33 is interposed is disposed. The liquid-sending pipe 32 sends a processing liquid to the processing liquid supply nozzle 10 disposed in the processing unit 5.

A liquid-sending valve 32a is interposed in the liquid-sending pipe 32. The liquid-sending valve 32a opens and closes a flow passage through which a processing liquid is sent and that performs switching between a discharge state in which a processing liquid is discharged from the processing liquid supply nozzle 10 to a substrate W and a discharge stop state in which the discharge of a processing liquid is stopped.

The internal pressure of the flow pipe 31 changes when the liquid-sending valve 32a is opened and when a processing liquid is sent from the flow pipe 31 to the liquid-sending pipe 32. In order to restrain or prevent a change in the internal pressure of the flow pipe 31, a pressure regulating valve 31a is interposed in the flow pipe 31 at a position on a more downstream side than a position at which the liquid-sending pipe 32 branches from the flow pipe 31. The pressure regulating valve 31a adjusts the opening degree of the flow passage of the flow pipe 31 and regulates the internal pressure of the flow pipe 31.

One end of the hypoxic fluid supply pipe 34 is connected to the hypoxic fluid supply source 104, and the other end thereof is flowingly connected to the storage portion 30. The hypoxic fluid supply pipe 34 supplies a hypoxic fluid to the flow pipe 31 through the storage portion 30. The term "hypoxic fluid" denotes a fluid whose oxygen concentration is lower than atmospheric air. In the present preferred embodiment, the hypoxic fluid is an inert gas, and, for example, a nitrogen gas is used.

A flow rate changing valve 34a that changes the supply flow rate of a hypoxic fluid is interposed in the hypoxic fluid supply pipe 34. The flow rate changing valve 34a adjusts the opening degree of a valving element (not shown), and adjustably changes the flow rate of a hypoxic fluid that is supplied to the flow pipe 31 through the storage portion 30.

In FIG. 1, the hypoxic fluid supply pipe 34 is flowingly connected so that its supply port 341 for a hypoxic fluid faces the inside of the storage portion 30. In an internal space of the storage portion 30, the supply port 341 of the hypoxic fluid supply pipe 34 is positioned and is open in a storage space in which a predetermined amount of processing liquid is stored. Therefore, the supply port 341 of the hypoxic fluid supply pipe 34 is disposed so as to reach a state of being immersed in a processing liquid when the processing liquid is stored in the storage portion 30.

One end of the drainage pipe 35 is connected to a drainage port (not shown) formed in a bottom surface of the storage portion 30, and the other end thereof is connected to a drainage portion 105 disposed outside the substrate processing apparatus in order to store a processing liquid that has been drained.

A drainage valve 35a is interposed in the drainage pipe 35. The drainage valve 35a opens and closes its flow passage and performs switching between a drainage state in which a processing liquid is drained from the storage portion 30 and a drainage stop state in which the drainage of a processing liquid is stopped.

The controller 6 includes a CPU (central processing unit), a ROM (read-only memory), a RAM (random-access memory), storage devices, etc. The controller 6 controls the rotation speed of a substrate W grasped by the spin chuck 15 by controlling the rotation speed of the rotational portion 17. Additionally, the controller 6 controls the flow or the flow rate of a processing liquid and of a hypoxic fluid by controlling the new liquid supply valve 37a, the drainage valve 35a, the liquid-sending valve 32a, the flow rate changing valve 34a, and the pump 30a. In the controller 6, the function of each functional controller described later is fulfilled by allowing the CPU to execute computer programs stored in the ROM or other storage media. A part or all of functional components of the controller 6 may be realized by hardware such as an electronic circuit.

2. Controller

Figure 2:
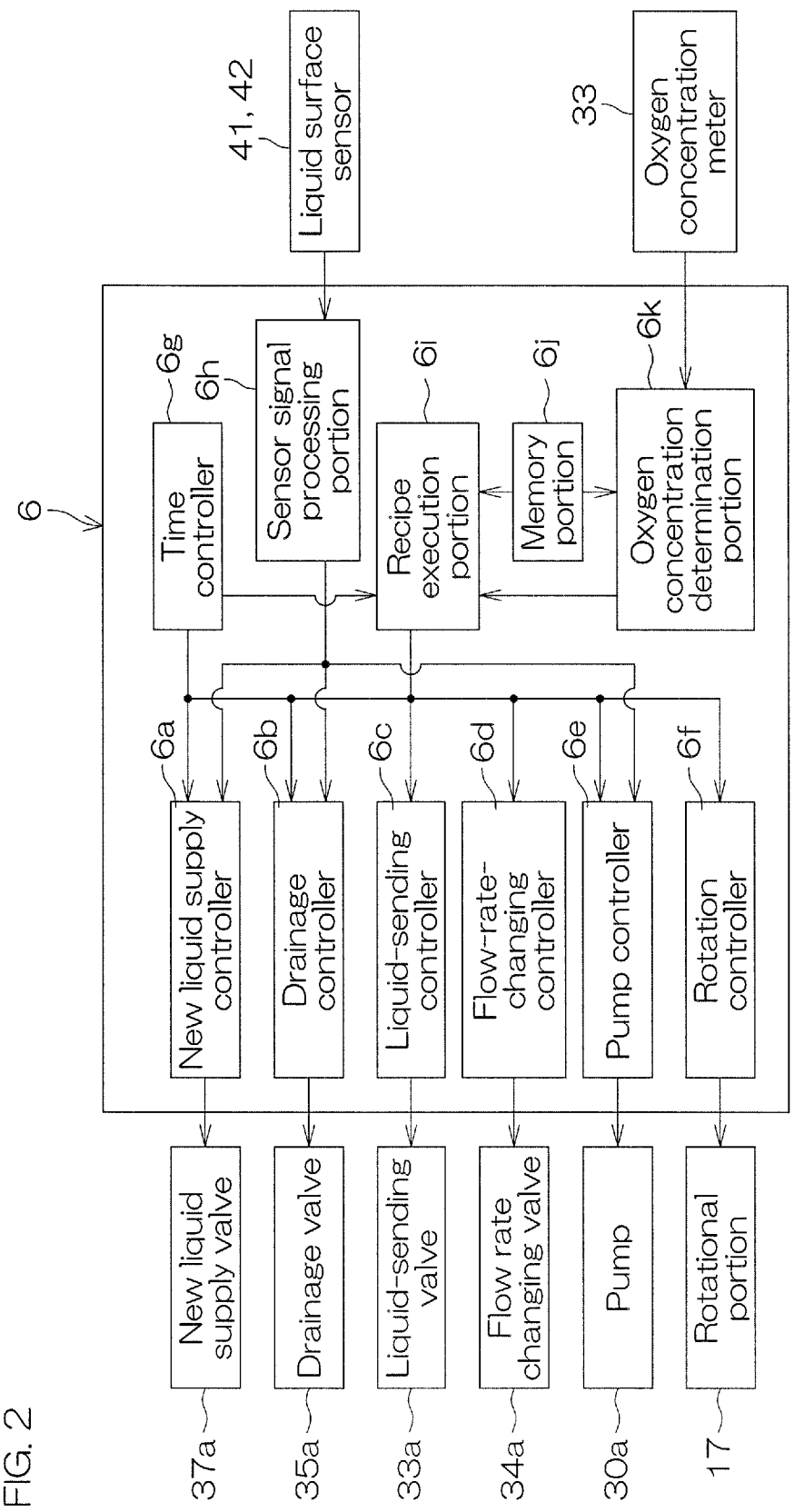
FIG. 2 is a block diagram showing a functional configuration of the substrate processing apparatus according to the first preferred embodiment of the present invention.

FIG. 2 is a block diagram showing a functional configuration of the controller 6 in the substrate processing apparatus 1. As shown in FIG. 2, the controller 6 includes functional controllers, i.e., includes a new liquid supply controller 6a, a drainage controller 6b, a liquid-sending controller 6c, a flow-rate-changing controller 6d, a pump controller 6e, a rotation controller 6f, a time controller 6g, a sensor signal processing portion 6h, a recipe execution portion 6i, a memory portion 6j, and an oxygen concentration determination portion 6k. The function of each of these functional controllers (6a to 6k) is fulfilled by allowing the CPU of the controller 6 to execute computer programs stored in storage media, such as the ROM or other storage devices.

The new liquid supply controller 6a controls the new liquid supply valve 37a so that it reaches an open state from a closed state when the storage portion 30 is empty or when a processing liquid is not sufficiently stored. As a result, the flow passage of the new liquid supply pipe 37 is opened, and a new processing liquid supplied from the processing liquid supply source 110 is supplied to the storage portion 30.

The drainage controller 6b controls the drainage valve 35a so that it reaches an open state from a closed state, for example, when a processing liquid is required to be replaced. As a result, the flow passage of the drainage pipe 35 is opened, and a processing liquid stored in the storage portion 30 is drained from the storage portion 30.

The liquid-sending controller 6c controls the liquid-sending valve 32a so that it reaches an open state from a closed state, for example, when a processing liquid is sent to the processing liquid supply nozzle 10 in order to process a substrate W. As a result, the flow passage of the liquid-sending pipe 32 is opened, and a processing liquid circulating in the flow pipe 31 is sent to the processing liquid supply nozzle 10 through the liquid-sending pipe 32.

The flow-rate-changing controller 6d performs an adjustably changing control operation so as to increase the opening degree of the flow rate changing valve 34a, for example, when a processing liquid stored in the storage portion 30 is replaced. As a result, the supply flow rate of a hypoxic fluid supplied from the hypoxic fluid supply source 104 is raised. A processing liquid in the flow pipe 31 is drained in response to the draining operation of a processing liquid from the storage portion 30 when the processing liquid is replaced. At this time, the flow-rate-changing controller 6d controls the flow rate changing valve 34a so that a hypoxic fluid is supplied to the flow pipe 31 until at least the inside of the flow pipe 31 is filled with the hypoxic fluid.

When a new processing liquid is supplied to the storage portion 30, the flow-rate-changing controller 6d performs a control operation so that the supply flow rate of a hypoxic fluid is increased by increasing the opening degree of the flow rate changing valve 34a after the liquid surface of the processing liquid becomes greater than the height of an opening position of the supply port 341 of the hypoxic fluid supply pipe 34.

The pump controller 6e controls the driving of the pump 30a, and circulates a processing liquid stored in the storage portion 30 through the circulated path consisting of the flow pipe 31. Additionally, the pump controller 6e controls the pump 30a so that a processing liquid is sent from the flow pipe 31 to the liquid-sending pipe 32 when the liquid-sending valve 32a is in an open state. Still additionally, the pump controller 6e controls the driving of the pump 30a so that a processing liquid remaining in the flow pipe 31 is drained from the inside of the flow pipe 31 when the processing liquid stored in the storage portion 30 is drained to the drainage portion 105.

When a substrate W is processed in the processing unit 5, the rotation controller 6f controls the rotation speed of an electric motor (not shown) that rotates the rotational portion 17, and hence controls the rotation speed of the substrate W grasped by the spin chuck 15.

The time controller 6g controls the operation start/end timing of the new liquid supply controller 6a, that of the drainage controller 6b, that of the liquid-sending controller 6c, that of the flow-rate-changing controller 6d, that of the pump controller 6e, that of the rotation controller 6f, and that of the recipe execution portion 6i.

When a new processing liquid is being supplied to the storage portion 30, the sensor signal processing portion 6h receives a signal indicating that the fixed-amount liquid surface sensor 41 has detected the liquid surface of a fixed-amount of processing liquid stored in the storage portion 30, and transmits a reception signal to the new liquid supply controller 6a. The new liquid supply controller 6a receives the reception signal from the sensor signal processing portion 6h, and controls the new liquid supply valve 37a so as to be closed, and stops the supply of the new processing liquid. Additionally, when the processing liquid is being drained from the storage portion 30, the sensor signal processing portion 6h receives a signal indicating that the lower-limit liquid surface sensor 42 has detected the fact that the liquid surface of the processing liquid stored in the storage portion 30 has become lower than a lower limit position, and transmits a reception signal to the drainage controller 6b. The drainage controller 6b receives the reception signal from the sensor signal processing portion 6h, and controls the drainage valve 35a so as to be closed, and stops the drainage of the processing liquid from the storage portion 30.

The recipe execution portion 6i reads a recipe for substrate processing, a pre-recipe for the preparation of substrate processing, and a recipe for liquid replacement, which have been stored in the memory portion 6j, and executes these recipes.

The oxygen concentration determination portion 6k determines whether the dissolved oxygen concentration of a processing liquid measured by the oxygen concentration meter 33 is a concentration suitable for substrate processing. If the oxygen concentration determination portion 6k determines that the oxygen concentration of the processing liquid has fallen to a predetermined concentration or lower, the oxygen concentration determination portion 6k allows the recipe execution portion 6i to execute the recipes. The predetermined concentration is a pre-set upper limit oxygen concentration required to appropriately process a substrate W.

3. Operation

Figure 3:
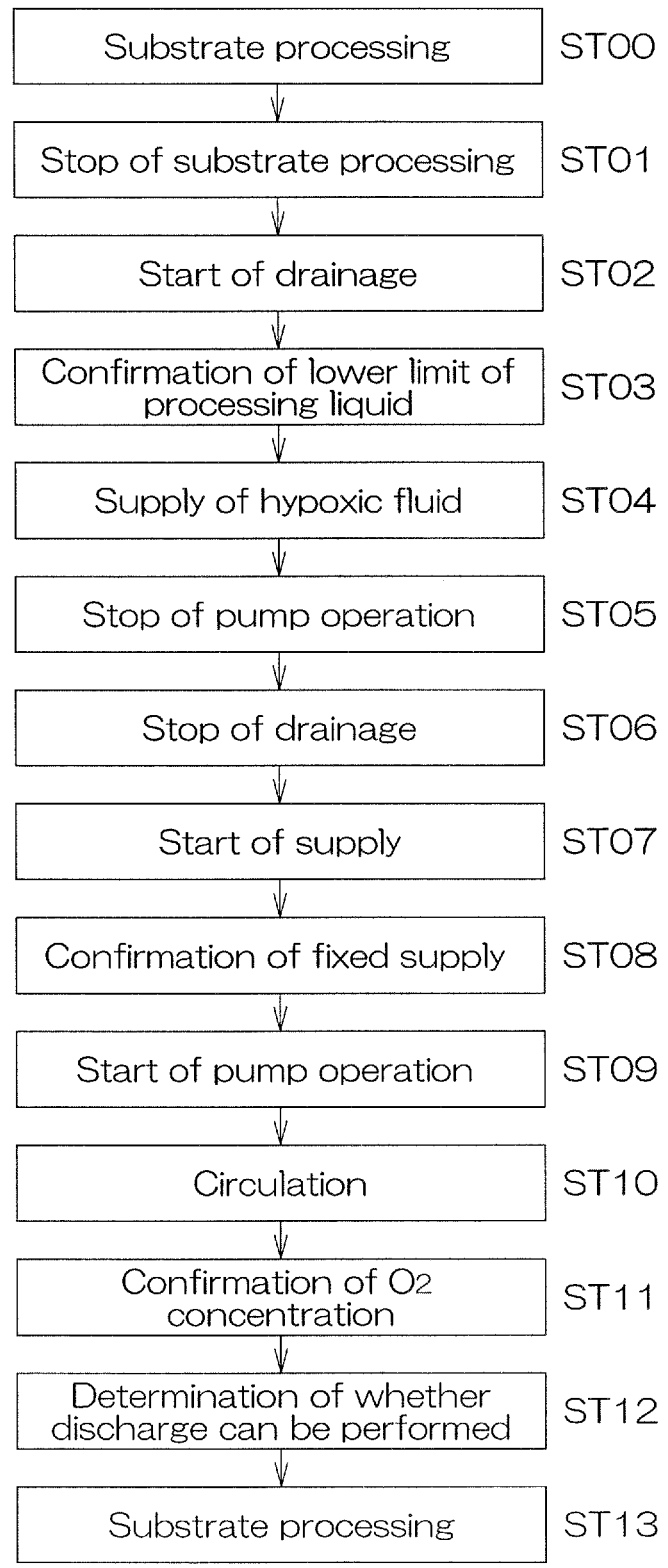
FIG. 3 is a flowchart showing the operation of the substrate processing apparatus according to the first preferred embodiment of the present invention.

Next, a description will be hereinafter given of operations of steps in which processing is stopped from a state in which a substrate W is being processed, and then a processing liquid stored in the storage portion 30 is replaced, and the substrate W starts being again processed. FIG. 3 is a flowchart showing the series of operations.

3-1. Stop of Substrate Processing from Substrate Processing State

In step ST00 of FIG. 3, the substrate processing apparatus 1 discharges a processing liquid from the processing liquid supply nozzle 10 onto each substrate W1 carried in, and is processing the substrate W in the processing unit 5 (ST00). In step ST00, whenever the substrate W is processed, the liquid-sending valve 32a interposed in the liquid-sending pipe 32 is controlled by the liquid-sending controller 6c so as to reach an open state from a closed state. On the other hand, the new liquid supply valve 37a, the drainage valve 35a, and the flow rate changing valve 34a are each kept in a state of being closed. When the substrate W is processed under this state, the processing liquid stored in the storage portion 30 is always circulated through the flow pipe 31 by means of the operation of the pump 30a. Together therewith, a part of the processing liquid flowing through the flow pipe 31 is sent to the liquid-sending pipe 32, and the processing liquid is discharged from the processing liquid supply nozzle 10 to the substrate W. When the substrate W finishes being processed, the substrate W is carried out from the processing unit 5 by means of a transfer robot (not shown). The processing operation applied to the substrate W is repeatedly performed until a final substrate W of one processing lot has been processed.

In step ST01, for example, if the time controller 6g has notified to the recipe execution portion 6i that it is the cycle for periodic replacement of a processing liquid stored in the storage portion 30, the recipe execution portion 6i transmits the notification signal to the liquid-sending controller 6c. The liquid-sending controller 6c receives the notification signal from the recipe execution portion 6i, and controls the liquid-sending valve 32a so that the liquid-sending valve 32a maintains its closed state. As a result, the substrate processing apparatus 1 stops the substrate processing without performing the following substrate processing (ST01).

3-2. Liquid Replacement in which New Processing Liquid is Supplied after Draining Processing Liquid After the substrate processing apparatus 1 stops substrate processing, the recipe execution portion 6i executes a liquid replacement recipe for processing-liquid replacement, which is recorded in the memory portion 6j, in step ST02. In the execution of the liquid replacement recipe, the recipe execution portion 6i transmits an execution instruction signal to the drainage controller 6b. The drainage controller 6b receives the instruction execution signal, and controls the drainage valve 35a so as to be switched from a closed state to an open state. As a result, the processing liquid starts being drained from the storage portion 30 to the drainage portion 105 through the drainage pipe 35 (ST02).

When a draining operation in which a processing liquid is drained from the storage portion 30 continues, the processing liquid stored in the storage portion 30 decreases, and the liquid surface height of the processing liquid is lowered. In step ST03, when the lower-limit liquid surface sensor 42 detects that the liquid surface height of the processing liquid has become lower than the lower limit position, its detection signal is transmitted to the sensor signal processing portion 6h (confirmation of lower limit of processing liquid). The sensor signal processing portion 6h receives the detection signal from the lower-limit liquid surface sensor 42, and transmits its reception signal to the drainage controller 6b. The drainage controller 6b receives the reception signal from the sensor signal processing portion 6h, and reaches a preparatory state to stop the drainage.

On the other hand, when the sensor signal processing portion 6h receives a detection signal indicating that the liquid surface height of the processing liquid has become lower than the lower limit position from the lower-limit liquid surface sensor 42, the sensor signal processing portion 6h transmits its reception signal to the flow-rate-changing controller 6d in step ST04. The flow-rate-changing controller 6d receives the reception signal from the sensor signal processing portion 6h, and controls the flow rate changing valve 34a interposed in the hypoxic fluid supply pipe 34 so that the opening degree of the flow rate changing valve 34a increases. As a result, a hypoxic fluid is supplied from the hypoxic fluid supply source 104 to the storage portion 30 through the hypoxic fluid supply pipe 34 (ST04). The hypoxic fluid supplied to the storage portion 30 fills a space of the inside of the storage portion 30.

When the processing liquid remaining in the storage portion 30 continues being further reduced, and is reduced up to a neighborhood of the bottom surface of the storage portion 30, the hypoxic fluid in the storage portion 30 also comes to be mixed with the processing liquid sent out from the sending opening 311 of the storage portion 30 to the flow pipe 31 by means of the pump 30a. The hypoxic fluid continues being supplied to the inside of the storage portion 30 uninterruptedly from the hypoxic fluid supply pipe 34, and therefore the ratio of the hypoxic fluid supplied to the flow pipe 31 through the storage portion 30 increases. As a result, the inside of the flow pipe 31 is gradually filled with the hypoxic fluid from its upstream side (the sending-opening-311 side of the storage portion 30) toward its downstream side (the return-opening-312 side), and the processing liquid remaining in the inside of the flow pipe 31 is drained from the return opening 312 by means of the hypoxic fluid.

The hypoxic fluid supplied to the flow pipe 31 also flows into the bypass pipe 313, and the inside of the bypass pipe 313 is also filled with the hypoxic fluid. As a result, the oxygen concentration meter 33 interposed in the bypass pipe 313 is also placed in a hypoxic atmosphere. The supply of a hypoxic fluid from the hypoxic fluid supply pipe 34 to the storage portion 30 (ST04) is continuously performed until at least the inside of the flow pipe 31 is completely filled with the hypoxic fluid. Therefore, it is possible to prevent the oxygen concentration meter 33 interposed in the bypass pipe 313 from being exposed to a fluid that contains highly-concentrated oxygen, such as atmospheric air, and it is possible to prevent a deterioration in the function of the oxygen concentration meter 33. This makes it possible to prevent a fall in efficiency caused when substrate processing is resumed.

After the inside of the flow pipe 31 is filled with the hypoxic fluid, the flow-rate-changing controller 6d decreases the opening degree of the flow rate changing valve 34a, and reduces the supply flow rate of the hypoxic fluid from the hypoxic fluid supply pipe 34 to the storage portion 30. It is possible to restrain the amount of consumption of a hypoxic fluid by reducing the supply flow rate of a hypoxic fluid. It should be noted that the opening degree of the flow rate changing valve 34a may be maintained without changes, and the supply flow rate of a hypoxic fluid to the storage portion 30 may be maintained in order to strictly maintain the hypoxic atmosphere of the inside of the storage portion 30 and that of the inside of the flow pipe 31. On the other hand, the flow rate changing valve 34a may be completely closed, and the supply of a hypoxic fluid to the storage portion 30 and to the flow pipe 31 may be stopped if it is possible to maintain the hypoxic atmosphere of the inside of the storage portion 30 and that of the inside of the flow pipe 31. This makes it possible to more reliably restrain the amount of consumption of a hypoxic fluid.

After it is ascertained by the lower-limit liquid surface sensor 42 that the processing liquid in the storage portion 30 is below the lower-limit amount, the time controller 6g determines that a period of time required to completely finish draining the processing liquid remaining both in the storage portion 30 and in the flow pipe 31 to the drainage portion 105 has elapsed. Thereupon, the time controller 6g transmits a signal indicating the time passage to the pump controller 6e. The pump controller 6e receives the signal from the time controller 6g, and controls the pump 30a, and stops the pump operation (ST05). At this time, the time controller 6g also transmits the same signal to the drainage controller 6b that is in a preparatory state to stop the drainage. The drainage controller 6b receives the signal from the time controller 6g, and controllably brings the drainage valve 35a into a closed state, and stops the drainage (ST06).

After the drainage is stopped, the new liquid supply controller 6a performs a control operation to open the new liquid supply valve 37a in order to supply a new processing liquid from the processing liquid supply source 110 to the storage portion 30. As a result, the new processing liquid starts being supplied from the new liquid supply pipe 37 to the storage portion 30 (ST07).

The liquid surface of the processing liquid stored in the storage portion 30 begins to rise when a new processing liquid begins to be supplied to the storage portion 30. After the liquid surface of the new processing liquid stored in the storage portion 30 becomes greater than the height of the supply port 341 of the hypoxic fluid supply pipe 34, the flow-rate-changing controller 6d changes the open-closed state of the flow rate changing valve 34a and increases the supply flow rate of the hypoxic fluid. This makes it possible to swiftly lower the dissolved oxygen concentration of the new processing liquid while restraining a gas from being mixed into the liquid because of liquid-surface disorder caused between the supply port 341 of the hypoxic fluid supply pipe 34 and the liquid surface of the processing liquid. In other words, it is possible to lower the dissolved oxygen concentration of the processing liquid by means of the bubbling of the hypoxic fluid in the processing liquid.

When the liquid surface height of the processing liquid continues rising, and reaches a height corresponding to a predetermined amount, the fixed-amount liquid surface sensor 41 detects the liquid surface of the processing liquid, and transmits a detection signal, which indicates the fixed-supply confirmation that a predetermined amount of processing liquid has been supplied to the storage portion 30, to the sensor signal processing portion 6*h*. The sensor signal processing portion 6*h* receives the detection signal from the fixed-amount liquid surface sensor 41, and transmits its reception signal to the new liquid supply controller 6*a*. The new liquid supply controller 6*a* that has received the reception signal from the sensor signal processing portion 6*h* performs a control operation to close the new liquid supply valve 37*a*, and the supply of a new liquid to the storage portion 30 is stopped (ST08).

3-3. Circulation of New Processing Liquid and Confirmation of Oxygen Concentration Additionally, the sensor signal processing portion 6*h* receives the aforementioned detection signal from the fixed-amount liquid surface sensor 41, and transmits its reception signal also to the pump controller 6*e*. The pump controller 6*e* that has received the reception signal from the sensor signal processing portion 6*h* controls the pump 30*a*, and drives the pump 30*a* (ST09).

When the pump 30*a* begins to be driven in a state in which the processing liquid is stored in the storage portion 30, the processing liquid stored in the storage portion 30 is sent from the sending opening 311 of the storage portion 30 to the flow pipe 31, and flows through the inside of the flow pipe 31, is then returned from the return opening 312 of the flow pipe 31 to the storage portion 30. As thus described, the flow pipe 31 forming a circulated path allows the processing liquid to flow and circulate through the storage portion 30 and through the inside of the flow pipe 31 (ST10).

The processing liquid sent out from the storage portion 30 to the flow pipe 31 also flows into the bypass pipe 313 that branches from the flow pipe 31, and the oxygen concentration is measured by the oxygen concentration meter 33 interposed in the bypass pipe 313 (ST11). A measured value of the oxygen concentration is sent from the oxygen concentration meter 33 to the oxygen concentration determination portion 6*k*, and it is determined whether the value has fallen to an oxygen concentration suitable for substrate processing. At this time, if it has fallen to the oxygen concentration suitable for substrate processing, the oxygen concentration determination portion 6*k* determines that a processing liquid can be discharged to the substrate W, and transmits a signal indicating that a processing liquid can be discharged to the substrate W to the recipe execution portion 6*i* (ST12).

3-4. Resumption of Substrate Processing after Confirmation of Oxygen Concentration The recipe execution portion 6*i* receives the signal indicating that a processing liquid can be discharged to the substrate W from the oxygen concentration determination portion 6*k*, and then reads a substrate processing recipe recorded in the memory portion 6*j*, and transmits a recipe execution signal to the liquid-sending controller 6*c* and to the rotation controller 6*f*. The rotation controller 6*f* that has received the recipe execution signal from the recipe execution portion 6*i* controllably rotates the rotational portion 17, thus rotating the substrate W held by the spin chuck 15. On the other hand, the liquid-sending controller 6*c* that has received the recipe execution signal from the recipe execution portion 6*i* controls the liquid-sending valve 32*a* so that the liquid-sending valve 32*a* reaches an open state. As a result, the processing liquid that has branched from the flow pipe 31 and that has been sent to the liquid-sending pipe 32 is supplied onto the substrate W being rotated from the processing liquid supply nozzle 10, and substrate processing is performed (ST13).

In the first preferred embodiment, when the processing liquid in the flow pipe 31 is drained from the flow pipe 31 in the substrate processing apparatus 1, the inside of the flow pipe 31 in which the oxygen concentration meter 33 is interposed is filled with a hypoxic fluid. This makes it possible to prevent the oxygen concentration meter 33 from being exposed to a fluid that contains highly-concentrated oxygen, such as atmospheric air, and therefore it is possible to prevent a deterioration in the function of the oxygen concentration meter 33. Therefore, it is possible to perform substrate processing without lowering processing efficiency.

Additionally, in the substrate processing apparatus 1, it is possible to replace the processing liquid stored in the storage portion 30 with a new processing liquid while filling the inside of the storage portion 30 and the inside of the flow pipe 31 with a hypoxic fluid in liquid replacement in which the processing liquid is drained from the storage portion 30 and then a new processing liquid is supplied. Therefore, it is possible to replace the processing liquid while preventing the oxygen concentration meter 33 from being exposed to a fluid that contains highly-concentrated oxygen, such as atmospheric air.

4. Substrate Processing Apparatus (Second Preferred Embodiment)

Figure 4:
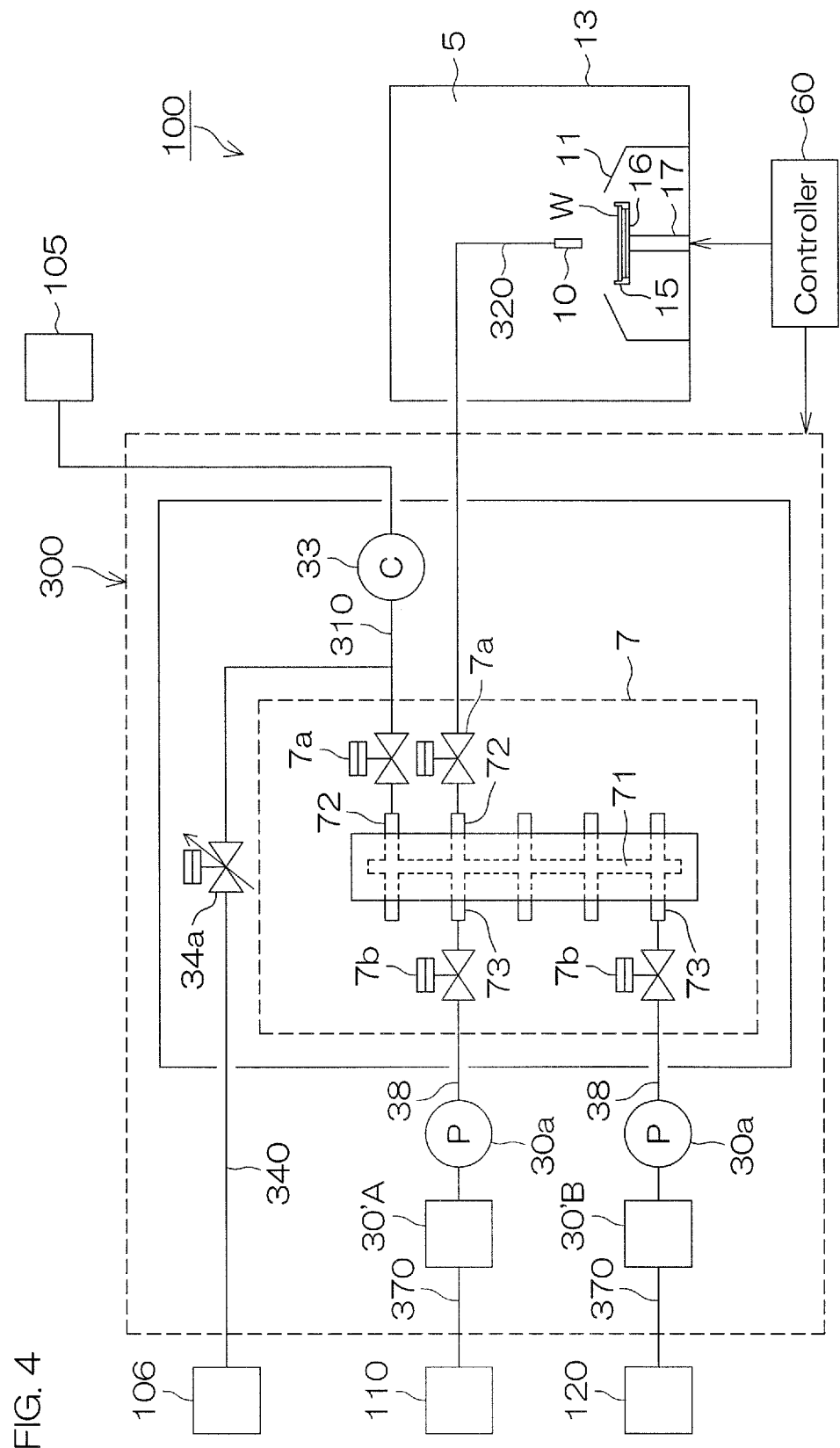
FIG. 4 is a schematic view showing a configuration of a substrate processing apparatus according to a second preferred embodiment of the present invention.

FIG. 4 is a schematic view showing a configuration of a substrate processing apparatus according to a second preferred embodiment of the present invention.

The substrate processing apparatus 100 according to the second preferred embodiment includes the processing unit 5 that processes a substrate W, a processing liquid supply portion 300 that supplies a processing liquid to the processing unit 5, and a controller 60 that controls the processing unit 5 and the processing liquid supply portion 300. The processing unit 5 and components of the processing unit 5 are the same as those of the first preferred embodiment shown in FIG. 1, and therefore the same reference sign is given to each of them, and a description thereof is omitted.

In the substrate processing apparatus 100 according to the second preferred embodiment, the processing liquid supply portion 300 is composed of storage portions 30' A and 30' B each of which stores a processing liquid, a new liquid supply pipe 370, a storage liquid supply pipe 38, a liquid-sending pipe 320, a flow pipe 310, a hypoxic fluid supply pipe 340, and a flow passage switching valve 7. Hereinafter, the storage portions 30'A and 30'B are referred to generically as the storage portion 30', if necessary.

The processing liquid supply portion 300 includes the storage portion 30' that stores a processing liquid, the new liquid supply pipe 370 that supplies a processing liquid from processing liquid supply sources 110 and 120 disposed outside the apparatus to the corresponding storage portion 30', the storage liquid supply pipe 38 that sends a processing liquid stored in the storage portion 30' from the storage portion 30' to a downstream side, and the flow passage switching valve 7 that is flowingly connected to the storage liquid supply pipe 38 and that performs switching among flow passages into which the processing liquid flows. The processing liquid supply portion 300 additionally includes the flow pipe 310 one end of which is flowingly connected to the flow passage switching valve 7 and that allows a processing liquid sent from the storage liquid supply pipe 38 to flow therethrough. The processing liquid supply portion 300 additionally includes the hypoxic fluid supply pipe 340 one end of which is flowingly connected to a hypoxic fluid supply source 106 disposed outside the apparatus and the other end of which is flowingly connected to the flow pipe 310 at its halfway position. The hypoxic fluid supply pipe 340 supplies a hypoxic fluid supplied from the hypoxic fluid supply source 106 to the flow pipe 310. The processing liquid supply portion 300 additionally includes the liquid-sending pipe 320 one end of which is flowingly connected to the flow passage switching valve 7 so as to form a flow passage different from the flow pipe 310 and the other end of which is flowingly connected to the processing liquid supply nozzle 10. The liquid-sending pipe 320 sends a processing liquid, which has been sent from the storage portion 30' through the storage liquid supply pipe 38, to the processing liquid supply nozzle 10.

In the present preferred embodiment, the hypoxic fluid supply source 106 disposed outside the apparatus is to supply ultrapure water (UPW). However, the hypoxic fluid is not necessarily required to be ultrapure water, and may be a nitrogen gas as in the first preferred embodiment.

Additionally, in the present preferred embodiment, the processing liquid supply source 110 is to supply, for example, hydrofluoric acid (hydrogen fluoride water) as a processing liquid, and the processing liquid supply source 120 is to supply, for example, deionized water (DIW) as a processing liquid.

One end of each of the new liquid supply pipes 370 is connected to the corresponding processing liquid supply source 110 or 120, and the other end thereof is connected to the corresponding storage portion 30'. A processing liquid supplied from the processing liquid supply source 110 or 120 is supplied to the corresponding storage portion 30' through the corresponding new liquid supply pipe 370.

A new liquid supply valve (not shown) is interposed in each of the new liquid supply pipes 370. The new liquid supply valve opens and closes a flow passage to perform switching between a supply state in which a processing liquid is supplied to the storage portion 30' and a supply stop state in which the supply of a processing liquid is stopped. Additionally, a metallic filter or a particle filter (not shown) is interposed in each of the new liquid supply pipes 370. A processing liquid supplied from the processing liquid supply source 110 is filtered to remove metal ions or foreign substances by use of the metallic filter or the particle filter, and is then supplied to the storage portion 30'.

One end of the storage liquid supply pipe 38 is flowingly connected to the storage portion 30', and the other end thereof is flowingly connected to the flow passage switching valve 7. A processing liquid stored in the storage portion 30' is sent to the flow passage switching valve 7 through the storage liquid supply pipe 38 by means of the pump 30a.

In the present preferred embodiment, a plurality of kinds of processing liquids are prepared in a plurality of storage portions 30'. Specifically, in FIG. 4, for example, hydrofluoric acid (hydrogen fluoride water) that serves as a processing liquid is stored in the storage portion 30'A, and, for example, deionized water (DIW) that serves as a processing liquid is stored in the storage portion 30'B.

The flow passage switching valve 7 is made as a multiple valve that includes a plurality of inflow passages 73, a plurality of outflow passages 72, an open-close valve 7b provided in each inflow passage 73, and an open-close valve 7a provided in each outflow passage 72 within the switching valve 7. A mixing chamber 71 in which processing liquids that have flowed in from each inflow passage 73 are mixed together is formed inside the flow passage switching valve 7. The processing liquid stored in the storage portion 30'A and the processing liquid stored in the storage portion 30'B are joined together in the mixing chamber 71 and are mixed together. The other end (i.e., downstream-side end) of each of the storage liquid supply pipes 38 is flowingly connected to the corresponding inflow passage 73 of the flow passage switching valve 7. One end (i.e., upstream-side end) of the flow pipe 310 is flowingly connected to one outflow passage 72 of the flow passage switching valve 7. One end (i.e., upstream-side end) of the liquid-sending pipe 320 is flowingly connected to another outflow passage 72 of the flow passage switching valve 7. The flow passage switching valve 7 performs switching between the flow pipe 310 and the liquid-sending pipe 320, into each of which the processing liquids sent from the storage liquid supply pipes 38 flow, by opening or closing each open-close valve 7a. For convenience, in order to show the flow-passage switching function of the flow passage switching valve 7, the open-close valves 7b and 7a are shown only with respect to the inflow passages 73 connected to the storage liquid supply pipes 38 and the outflow passages 72 connected to the flow pipe 310 and to the liquid-sending pipe 320 in FIG. 4.

Although the flow passage switching valve 7 is made as the multiple valve in the second preferred embodiment as an example, the flow passage switching valve 7 may be made as a three-way valve without being limited to the form of the multiple valve.

The liquid-sending pipe 320 sends the processing liquid mixed in the mixing chamber 71 of the flow passage switching valve 7 to the processing liquid supply nozzle 10 when a substrate W is processed. The processing liquid is supplied from the processing liquid supply nozzle 10 onto the substrate W being rotated, and the substrate W is processed.

On the other hand, the oxygen concentration meter 33 is interposed in the flow pipe 310 that forms a processing-liquid flow passage different from the liquid-sending pipe 320 at its halfway position. The other end of the hypoxic fluid supply pipe 340 is flowingly connected to the flow pipe 310 at a position on a more upstream side than a position at which the oxygen concentration meter 33 is interposed. The other end (i.e., downstream-side end) of the flow pipe 310 is flowingly connected to the drainage portion 105 disposed outside the apparatus. The flow pipe 310 is used to allow the processing liquid mixed in the mixing chamber 71 of the flow passage switching valve 7 to flow therethrough, and to measure the oxygen concentration of the processing liquid by means of the oxygen concentration meter 33, for example, before the substrate W is processed. The processing liquid, which has flown through the flow pipe 310 and whose oxygen concentration has been measured by the oxygen concentration meter 33, is drained to the drainage portion 105.

When a substrate W is being processed, the hypoxic fluid supply pipe 340 supplies a hypoxic fluid to the flow pipe 310 so that the inside of the flow pipe 310 is filled with the hypoxic fluid.

The flow rate changing valve 34a that changes the supply flow rate of a hypoxic fluid is interposed in the hypoxic fluid supply pipe 340. The flow rate changing valve 34a adjusts the opening degree of a valving element (not shown), and adjustably changes the supply flow rate of a hypoxic fluid that is supplied from the hypoxic fluid supply pipe 340 to the flow pipe 310.

The controller 60 includes a CPU (central processing unit), a ROM (read-only memory), a RAM (random-access memory), storage devices, etc. The controller 60 controls the rotation speed of a substrate W grasped by the spin chuck 15 by controlling the rotation speed of the rotational portion 17. Additionally, the controller 60 controls the flow or the flow rate of a processing liquid and of a hypoxic fluid by controlling the flow passage switching valve 7, the flow rate changing valve 34a, and the pump 30a. In the controller 60, the function of each functional controller described later is fulfilled by allowing the CPU to execute computer programs stored in the ROM or other storage media. A part or all of functional components of the controller 60 may be realized by hardware such as an electronic circuit.

5. Controller

Figure 5:
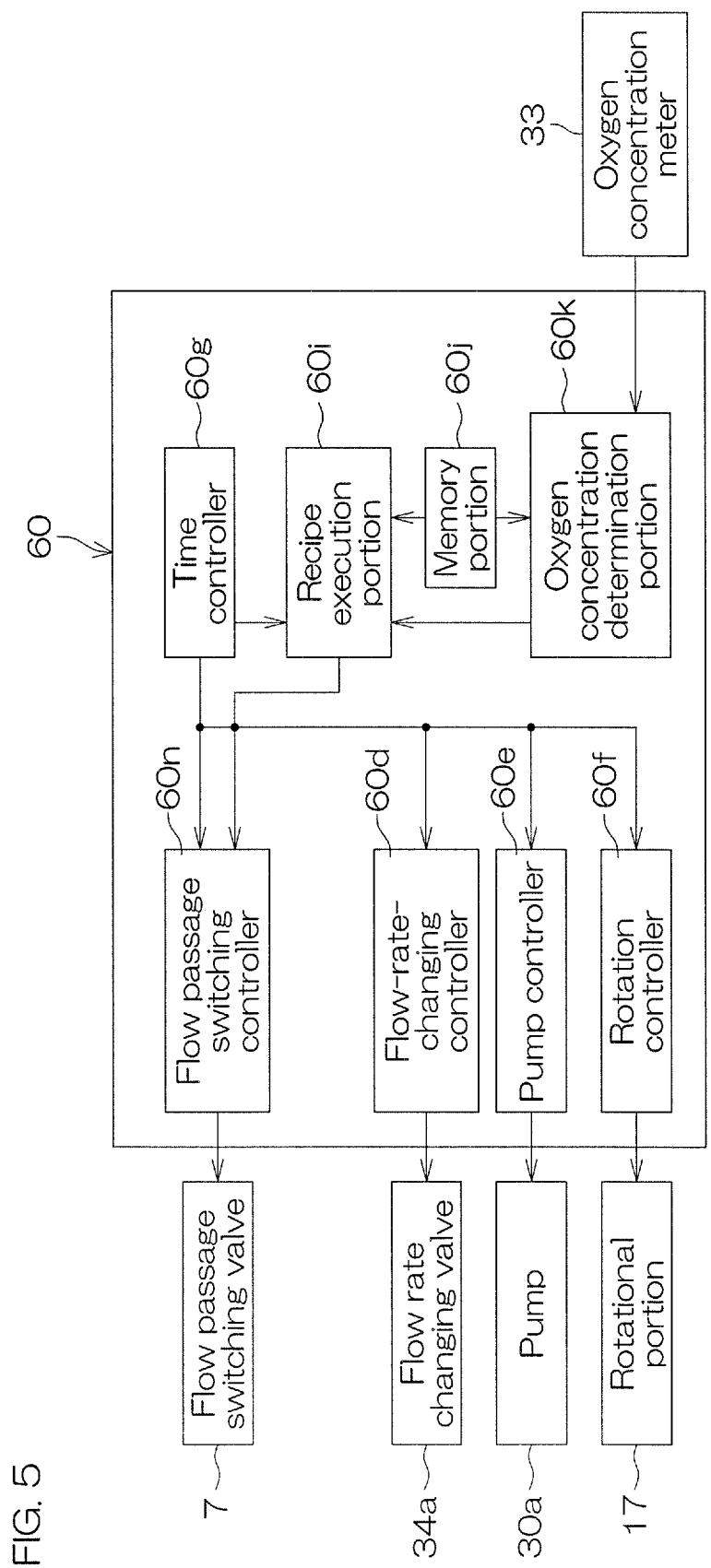
FIG. 5 is a block diagram showing a functional configuration of the substrate processing apparatus according to the second preferred embodiment of the present invention.

FIG. 5 is a block diagram showing a functional configuration of the controller 60 of the substrate processing apparatus 100 of the second preferred embodiment. As shown in FIG. 5, the controller 60 includes functional controllers, i.e., includes a flow passage switching controller 60n, a flow-rate-changing controller 60d, a pump controller 60e, a rotation controller 60f, a time controller 60g, a recipe execution portion 60i, a memory portion 60j, and an oxygen concentration determination portion 60k. The function of each of these functional controllers is fulfilled by allowing the CPU of the controller 60 to execute computer programs stored in storage media, such as the ROM or other storage devices.

When processing liquids stored in the storage portion 30' are sent to the flow pipe 310 or to the liquid-sending pipe 320 through the flow passage switching valve 7, the flow passage switching controller 60n controls the open-close valves 7b, which are provided in the inflow passages 73 of the flow passage switching valve 7 (i.e., the inflow passages 73 flowingly connected to the storage liquid supply pipes 38), so that they reach an open state from a closed state. As a result, the processing liquids supplied from the storage portions 30' (i.e., each processing liquid stored in the storage portion 30'A and in the storage portion 30'B) are allowed to flow into the mixing chamber 71 of the flow passage switching valve 7 through the new liquid supply pipes 370.

Additionally, when the processing liquid is sent to the flow pipe 310 so as to measure the oxygen concentration of the processing liquid, the flow passage switching controller 60n controls the open-close valve 7a, which is provided in the outflow passage 72 of the flow passage switching valve 7 (i.e., the outflow passage 72 flowingly connected to the flow pipe 310), so that it reaches an open state from a closed state. As a result, a processing liquid obtained by mixing the processing liquids together in the mixing chamber 71 of the flow passage switching valve 7 is supplied to the flow pipe 310.

On the other hand, when the processing liquid is sent to the processing liquid supply nozzle 10, the flow passage switching controller 60n controls the open-close valve 7a, which is provided in the outflow passage 72 of the flow passage switching valve 7 (i.e., the outflow passage 72 flowingly connected to the liquid-sending pipe 320), so that it reaches an open state from a closed state. As a result, a processing liquid obtained by mixing the processing liquids together in the mixing chamber 71 of the flow passage switching valve 7 is sent to the processing liquid supply nozzle 10.

The flow-rate-changing controller 60d adjustably changes the opening degree of the flow rate changing valve 34a so that the opening degree thereof increases when the processing liquid is not supplied to the flow pipe 310, i.e., for example, when the substrate W is being processed. As a result, the hypoxic fluid supplied from the hypoxic fluid supply source 104 is supplied to the flow pipe 310 through the hypoxic fluid supply pipe 340. Additionally, the flow-rate-changing controller 60d adjustably changes the opening degree of the flow rate changing valve 34a so that the opening degree thereof decreases when the processing liquid is supplied to the flow pipe 310, i.e., for example, when the oxygen concentration of the processing liquid is measured in a standby state before the substrate W starts being processed. Hence, the flow-rate-changing controller 60d makes the flow rate of the hypoxic fluid supplied to the flow pipe 310 from the hypoxic fluid supply pipe 340 smaller or a zero.

The pump controller 60e controls the driving of the pumps 30a so that the processing liquids stored in the storage portions 30' are supplied to the storage liquid supply pipes 38.

When a substrate W is processed in the processing unit 5, the rotation controller 60f controls the rotation speed of an electric motor (not shown) that rotates the rotational portion 17, and hence controls the rotation speed of the substrate W grasped by the spin chuck 15.

The time controller 60g controls the operation start/end timing of the flow passage switching controller 60n, that of the flow-rate-changing controller 60d, that of the pump controller 60e, that of the rotation controller 60f, and that of the recipe execution portion 60i.

The recipe execution portion 60i reads, for example, a recipe for substrate processing, a pre-recipe for the preparation of substrate processing, and a recipe for liquid replacement, which have been stored in the memory portion 60j, and executes these recipes.

The oxygen concentration determination portion 60k determines whether the oxygen concentration of a processing liquid measured by the oxygen concentration meter 33 has fallen to a predetermined concentration suitable for substrate processing or lower. If the oxygen concentration determination portion 60k determines that the oxygen concentration of the processing liquid has fallen to the predetermined concentration or lower, the oxygen concentration determination portion 60k allows the recipe execution portion 60i to execute the recipes. Herein, the predetermined concentration is a pre-set upper limit oxygen concentration required to appropriately process a substrate W.

6. Operation

Figure 6:
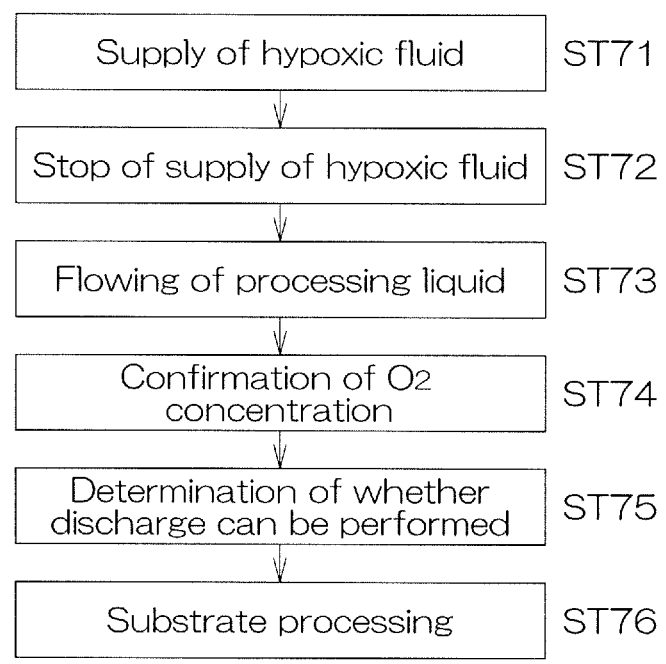
FIG. 6 is a flowchart showing the operation of the substrate processing apparatus according to the second preferred embodiment of the present invention.

Next, a description will be hereinafter given of operations performed until the substrate processing apparatus 100 starts processing a substrate W from a standby state in which the substrate W has not yet been processed. FIG. 6 is a flowchart showing the series of operations.

6-1. Standby State in which Substrate is not Processed

In step ST71 of FIG. 6, the substrate processing apparatus 100 is in a standby state in which substrate processing is not performed without carrying a substrate W into the processing unit 5, and the flow-rate-changing controller 60d performs a control operation so that the flow rate changing valve 34a is in an open state. In this state, a hypoxic fluid is supplied from the hypoxic fluid supply source 104 to the flow pipe 310 through the hypoxic fluid supply pipe 340 (ST71). The flow passage switching controller 60*n* controls the open-close valves 7*b* provided in the inflow passages 73 of the flow passage switching valve 7 to which the storage liquid supply pipes 38 are flowingly connected so that the open-close valves 7*b* reaches a closed state. Additionally, the flow passage switching controller 60*n* controls the open-close valve 7*a* provided in the outflow passage 72 of the flow passage switching valve 7 to which the flow pipe 310 is flowingly connected so that the open-close valve 7*a* reaches a closed state. Additionally, the flow passage switching controller 60*n* controls the open-close valve 7*a* provided in the outflow passage 72 of the flow passage switching valve 7 to which the liquid-sending pipe 320 is flowingly connected so that the open-close valve 7*a* reaches a closed state. These operations prevent the processing liquid from flowing to the flow pipe 310 and to the liquid-sending pipe 320. The inside of the flow pipe 310 is filled with a hypoxic fluid supplied through the hypoxic fluid supply pipe 340, and therefore it is possible to prevent the oxygen concentration meter 33 interposed in the flow pipe 310 from being exposed to a fluid that contains highly-concentrated oxygen, such as atmospheric air. Therefore, it is possible to prevent a deterioration in the function of the oxygen concentration meter 33, and it is possible to perform substrate processing without lowering processing efficiency.

6-2. Confirmation of Oxygen Concentration Before Start of Substrate Processing from Standby State In step ST72, a shift is made from a standby state of the substrate processing apparatus 100 in step ST71 to a preparatory state before executing processing to a substrate W in the processing unit 5. In step ST72, the recipe execution portion 60*i* starts executing a substrate processing recipe stored in the memory portion 60*j*. First, the recipe execution portion 60*i* transmits a control signal indicating a preparation command before executing processing to the substrate W to the flow-rate-changing controller 60*d*. The flow-rate-changing controller 60*d* receives the control signal from the recipe execution portion 60*i*, and then controllably changes the flow rate changing valve 34*a* so as to decrease the opening degree of the flow rate changing valve 34*a*. As a result, the supply flow rate of the hypoxic fluid sent to the flow pipe 310 is made smaller or a zero (ST72).

On the other hand, in step ST73, the recipe execution portion 60*i* transmits a control signal indicating the aforementioned preparation command to the pump controller 60*e* and to the flow passage switching controller 60*n*. The pump controller 60*e* receives the control signal from the recipe execution portion 60*i*, and then allows the pumps 30*a* to send the processing liquids stored in the storage portions 30' (the storage portion 30'A and the storage portion 30'B) toward the flow passage switching valve 7 while controllably driving the pumps 30*a*. The flow passage switching controller 60*n* receives the control signal indicating the preparation command from the recipe execution portion 60*i*, and then controls the open-close valves 7*b* provided in the inflow passages 73 of the flow passage switching valve 7 to which the storage liquid supply pipes 38 are flowingly connected so as to reach an open state, and controls the open-close valve 7*a* provided in the outflow passage 72 of the flow passage switching valve 7 to which the flow pipe 310 is flowingly connected so as to reach an open state.

As a result, processing liquids that have flowed into the flow passage switching valve 7 are mixed together in the mixing chamber 71, and the resulting processing liquid is then supplied into the flow pipe 310. As a result, the hypoxic fluid inside the flow pipe 310 is replaced with the resulting processing liquid (ST73).

Thereafter, the oxygen concentration of the processing liquid flowing through the flow pipe 310 is measured by the oxygen concentration meter 33 in step ST74. The value of the oxygen concentration measured thereby is sent from the oxygen concentration meter 33 to the oxygen concentration determination portion 60*k* (ST74).

In step ST75, from the value of the oxygen concentration sent therefrom, the oxygen concentration determination portion 60*k* ascertains whether the value is not more than a predetermined oxygen concentration suitable for substrate processing, and determines whether the processing liquid can be discharged from the processing liquid supply nozzle 10. At this time, if the value has fallen to the oxygen concentration suitable for substrate processing, the oxygen concentration determination portion 60*k* determines that the processing liquid can be discharged to the substrate W, and transmits a signal indicating that the processing liquid can be discharged to the substrate W to the recipe execution portion 60*i* (ST75).

6-3. Start of Substrate Processing after Confirmation of Oxygen Concentration

Thereafter, the recipe execution portion 60*i* receives a recipe execution signal indicating that the processing liquid can be discharged to the substrate W from the oxygen concentration determination portion 60*k*, and performs a control operation to execute substrate processing to the substrate W in step ST76. In other words, the recipe execution portion 60*i* reads a processing recipe to perform substrate processing stored in the memory portion 60*j*, and, based on the processing recipe read therefrom, transmits a control signal to cause execution of substrate processing to the flow passage switching controller 60*n*, to the rotation controller 60*f*, and to the flow-rate-changing controller 60*d*.

The flow passage switching controller 60*n* receives the recipe execution signal from the recipe execution portion 60*i*, and then controls the open-close valve 7*a* provided in the outflow passage 72 of the flow passage switching valve 7 to which the flow pipe 310 is flowingly connected so as to reach a closed state from an open state. Additionally, the flow passage switching controller 60*n* controls the open-close valve 7*a* provided in the outflow passage 72 of the flow passage switching valve 7 to which the liquid-sending pipe 320 is flowingly connected so as to reach an open state from a closed state.

The open-close valves 7*b* provided in the inflow passages 73 of the flow passage switching valve 7 to which the storage liquid supply pipes 38 are flowingly connected are kept in the open state. Therefore, the processing liquids mixed in the mixing chamber 71 of the flow passage switching valve 7 will stop being sent to the flow pipe 310, and, on the other hand, will be sent to the liquid-sending pipe 320.

Additionally, the rotation controller 60*f* receives the recipe execution signal from the recipe execution portion 60*i*, and then performs a control operation so that the rotational portion 17 rotates, thus rotating the substrate W held by the spin chuck 15.

Through these steps, the processing liquid is supplied to the substrate W being rotated in the processing unit 5, and the substrate W is processed.

On the other hand, the flow-rate-changing controller 60*d* receives the recipe execution signal from the recipe execution portion 60*i*, and controllably changes the flow rate changing valve 34*a* so as to increase the opening degree of the flow rate changing valve 34*a*. The flow rate of a hypoxic fluid supplied from the hypoxic fluid supply pipe 340 to the flow pipe 310 is increased by increasing the opening degree of the flow rate changing valve 34*a*. As a result, the processing liquid remaining in the flow pipe 310 is swept away to the downstream side, and is drained to the drainage portion 105, and also the inside of the flow pipe 310 is filled with a hypoxic fluid. As a result, the oxygen concentration meter 33 interposed in the flow pipe 310 is protected by the fluid whose oxygen concentration is low. In other words, even in a situation in which the substrate W is being processed and in which a processing liquid is not sent into the flow pipe 310, it is possible to prevent the oxygen concentration meter from being exposed to a fluid that contains highly-concentrated oxygen, such as atmospheric air.

In the second preferred embodiment, in the substrate processing apparatus 100, the inside of the flow pipe 310 in which the oxygen concentration meter 33 is interposed is filled with a hypoxic fluid when the processing liquid in the flow pipe 310 is drained. This makes it possible to prevent the oxygen concentration meter 33 from being exposed to a fluid that contains highly-concentrated oxygen, such as atmospheric air, and hence makes it possible to prevent the oxygen concentration meter 33 from being lowered in function. As a result, it is possible to perform substrate processing without lowering processing efficiency.

Additionally, when the substrate processing apparatus 100 is in a standby state in which the substrate processing apparatus 100 does not process a substrate W, a hypoxic fluid is supplied to the flow pipe 310, and the inside of the flow pipe 310 is filled with the hypoxic fluid. This makes it possible to prevent the oxygen concentration meter 33 interposed in the flow pipe 310 from being exposed to a fluid that contains highly-concentrated oxygen, such as atmospheric air.

Additionally, also when the substrate processing apparatus 100 is performing substrate processing and when a processing liquid is sent to the liquid-sending pipe 320 and is discharged from the processing liquid supply nozzle 10 to a substrate W, it is possible to fill the inside of the flow pipe 310 with a hypoxic fluid supplied to the flow pipe 310 in which the oxygen concentration meter 33 is interposed. This makes it possible to prevent the oxygen concentration meter 33 interposed in the flow pipe 310 from being exposed to a fluid that contains highly-concentrated oxygen, such as atmospheric air.

7. Modifications

As described in the first preferred embodiment, hydrofluoric acid is used as a processing liquid that is a chemical solution, and deionized water (DIW) is used as a processing liquid that is a rinse liquid, and IPA is used as a processing liquid that is an organic solvent. Of course, the chemical solution is not limited to hydrofluoric acid, and may be a liquid including at least one among hydrochloric acid, buffered fluoric acid (BHF), diluted fluoric acid (DHF), aqueous ammonia, organic acid (e.g., citric acid or oxalic acid), organic alkali (e.g., tetramethylammonium hydroxide (TMAH)), surfactant, and corrosion inhibitor. The rinse liquid is not limited to DIW, and may be carbonated water, electrolyzed ion water, hydrochloric acid water having a diluted concentration (e.g., about 10 ppm to 100 ppm), aqueous ammonia, or restoration water (hydrogenated water). The organic solvent is not limited to IPA. Specifically, the organic solvent may be a liquid including at least one among IPA, HFE (hydrofluoroether), methanol, ethanol, acetone, and Trans-1,2-dichloroethylene. Additionally, the organic solvent is not required to consist of only a mono-component, and may be a liquid mixed with other components. For example, the organic solvent may be a mixed liquid of both an IPA solution and deionized water, or may be a mixed liquid of both an IPA solution and an HFE solution.

Additionally, as described in the second preferred embodiment, hydrofluoric acid or deionized water (DIW) is used as a processing liquid, and yet the present invention is not limited to this, and it is possible to use each processing liquid in the same way as in the first preferred embodiment.

As described in the first preferred embodiment, when a processing liquid stored in the storage portion 30 is drained, the supply of a hypoxic fluid to the storage portion 30 is started after the fact that the liquid surface of the processing liquid stored in the storage portion 30 has been lowered is detected by the lower-limit liquid surface sensor 42. However, the timing of the supply of the hypoxic fluid may be set to be before the liquid surface of the processing liquid being drained is detected by the lower-limit liquid surface sensor 42. For example, it is allowable to employ a process in which, when a predetermined period of time elapses after the start of drainage, the time controller 6*g* transmits a signal to the flow-rate-changing controller 6*d*, and, in response to this, the flow-rate-changing controller 6*d* controls the flow rate changing valve 34*a*, and starts the supply of a hypoxic fluid to the storage portion 30.

As described in the first preferred embodiment, the timing to drive the pump 30*a* after supplying a new processing liquid to the storage portion 30 is set to be after the liquid surface of the new processing liquid rises to the position of the fixed-amount liquid surface sensor 41 disposed in the storage portion 30 and after the fixed-amount liquid surface sensor 41 ascertains a fixed supply. However, the pump 30*a* may be driven before the fixed supply is ascertained. For example, a timing at which the pump 30*a* starts being driven may be set to be after a predetermined fixed period of time elapses after the supply of a new processing liquid is started, and be set to be before a fixed-supply confirmation.

As mentioned in the mode of FIG. 4 showing the second preferred embodiment, two kinds of processing liquids are used as a plurality of processing liquids, and yet three or more kinds of processing liquids may be used in accordance with processing liquids necessary for substrate processing. In this case, three or more storage liquid supply pipes 38 are connected to three or more inflow passages 73 of the flow passage switching valve 7 of FIG. 4, respectively.

The second preferred embodiment is not limited to the mode of FIG. 4, and is also applicable to a substrate processing apparatus that uses one kind of processing liquid. For example, substrate processing may be performed by the supply of a processing liquid from only the processing liquid supply source 110. In this case, the mixing chamber 71 formed inside the flow passage switching valve 7 functions as a flow passage.

The processing liquid supply sources 110, 120, the hypoxic fluid supply sources 104, 106, and the drainage portion 105 in the first and second preferred embodiments may be incorporated in the corresponding substrate processing apparatus 1 or in the corresponding substrate processing apparatus 100, or may be the facilities of a factory in which the substrate processing apparatus 1 or the substrate processing apparatus 100 is placed.

8. Correspondence Between Each Element of the Claims and Each Component of the Preferred Embodiments A description will be hereinafter given of examples of each element of the claims and each component of the preferred embodiments, and yet the present invention is not limited to the following examples.

In the first preferred embodiment, the substrate processing apparatus 1 is an example of a substrate processing apparatus, the processing liquid supply nozzle 10 is an example of a processing liquid supply nozzle, the processing unit 5 is an example of a processing portion, the storage portion 30 is an example of a storage portion, the liquid-sending pipe 32 is an example of a liquid-sending pipe, the flow pipe 31 is an example of a flow pipe, the oxygen concentration meter 33 is an example of an oxygen concentration meter, the hypoxic fluid supply pipe 34 is an example of a hypoxic fluid supply pipe, the flow rate changing valve 34a is an example of a flow rate changing valve, the controller 6 is an example of a controller, and the flow-rate-changing controller 6d is an example of a flow-rate-changing controller.

Additionally, in the second preferred embodiment, the substrate processing apparatus 100 is an example of a substrate processing apparatus, the processing liquid supply nozzle 10 is an example of a processing liquid supply nozzle, the processing unit 5 is an example of a processing portion, the storage portion 30' is an example of a storage portion, the liquid-sending pipe 320 is an example of a liquid-sending pipe, the flow pipe 310 is an example of a flow pipe, the oxygen concentration meter 33 is an example of an oxygen concentration meter, the hypoxic fluid supply pipe 340 is an example of a hypoxic fluid supply pipe, the flow rate changing valve 34a is an example of a flow rate changing valve, the controller 60 is an example of a controller, and the flow-rate-changing controller 60d is an example of a flow-rate-changing controller.

Although the preferred embodiments of the present invention have been described in detail, these preferred embodiments are merely concrete examples used to clarify the technical contents of the present invention, and the present invention should not be understood by being limited to these concrete examples, and the scope of the present invention is limited solely by the appended claims.

What is claimed is:

1. A substrate processing apparatus that processes a substrate, the substrate processing apparatus comprising:
   a processing portion that has a processing liquid supply nozzle and that supplies a processing liquid from the processing liquid supply nozzle to a substrate to process the substrate;
   a storage portion that stores the processing liquid supplied from a processing liquid supply source;
   a liquid-sending pipe that sends the processing liquid stored in the storage portion to the processing liquid supply nozzle;
   a flow pipe that forms a flow passage different from the liquid-sending pipe and that allows the processing liquid to flow through the flow passage;
   an oxygen concentration meter that is interposed in the flow pipe and that measures a concentration of oxygen dissolved in the processing liquid flowing through the flow pipe;
   a hypoxic fluid supply pipe that is in communication with the flow pipe and that sends a hypoxic fluid supplied from a hypoxic fluid supply source to the flow pipe;
   a flow rate changing valve that is interposed in the hypoxic fluid supply pipe and that changes a supply flow rate of the hypoxic fluid to the flow pipe; and
   a controller including a flow-rate-changing controller that controls the flow rate changing valve so that the hypoxic fluid is supplied to the flow pipe until at least an inside of the flow pipe is filled with the hypoxic fluid when the processing liquid inside the flow pipe is drained.

2. The substrate processing apparatus according to claim 1 further comprising a pump that is interposed in the flow pipe and that sends a processing liquid stored in the storage portion,
   wherein the flow pipe forms a circulated path that circulates a processing liquid stored in the storage portion inside the flow pipe by flowingly connecting one end of the flow pipe to a sending opening that is provided in the storage portion and from which a processing liquid is sent and by flowingly connecting an opposite end of the flow pipe to a return opening that is provided in the storage portion and to which a processing liquid returns, and
   the liquid-sending pipe branches from a position on a more downstream side of the flow pipe than a position at which the oxygen concentration meter is interposed, and is flowingly connected to the flow pipe, and sends the processing liquid that has been sent from the storage portion through the flow pipe to the processing liquid supply nozzle.

3. The substrate processing apparatus according to claim 1, wherein the hypoxic fluid supply pipe has a hypoxic fluid supply port that is flowingly connected to the storage portion so that the hypoxic fluid supply port faces an inside of the storage portion, and the hypoxic fluid supply pipe is in communication with the flow pipe through the storage portion, and the hypoxic fluid supply pipe sends a hypoxic fluid supplied from the hypoxic fluid supply source to the flow pipe.

4. The substrate processing apparatus according to claim 1 further comprising:
   a drainage pipe that is flowingly connected to the storage portion and that drains the processing liquid stored in the storage portion; and
   a drainage valve that is interposed in the drainage pipe and that opens and closes a flow passage of the drainage pipe,
   wherein the controller includes a drainage valve controller that opens and closes the drainage valve and that controls switching between a state in which the processing liquid stored in the storage portion is drained from the storage portion and a state in which the processing liquid stored in the storage portion is not drained from the storage portion.

5. The substrate processing apparatus according to claim 1, wherein the oxygen concentration meter is disposed in a bypass pipe that branches from the flow pipe.

6. The substrate processing apparatus according to claim 1 further comprising:
   a new liquid supply pipe that is flowingly connected to the storage portion and that supplies the processing liquid, which is new and which is supplied from the processing liquid supply source, to the storage portion; and
   a new liquid supply valve that is interposed in the new liquid supply pipe and that opens and closes a flow passage of the new liquid supply pipe,
   wherein the controller further includes a new liquid supply controller that opens and closes the new liquid supply valve and that controls switching between a supply state in which the new processing liquid supplied from the processing liquid supply source is supplied to the storage portion and a non-supply state in which the new processing liquid supplied from the processing liquid supply source is not supplied to the storage portion.

7. The substrate processing apparatus according to claim 6, wherein the flow-rate-changing controller changes an open-closed state of the flow rate changing valve and increases a supply flow rate of a hypoxic fluid in a state in which the new processing liquid is being supplied from the processing liquid supply source to the storage portion.

8. The substrate processing apparatus according to claim 7, wherein a supply port of the hypoxic fluid supply pipe is positioned in a storage space of the storage portion, and
the flow-rate-changing controller changes an open-closed state of the flow rate changing valve and increases a supply flow rate of a hypoxic fluid after a liquid surface of the new processing liquid stored in the storage portion becomes greater than a height of the supply port of the hypoxic fluid supply pipe.

9. The substrate processing apparatus according to claim 1 further comprising:
a storage liquid supply pipe that sends a processing liquid stored in the storage portion to a downstream side; and
a flow passage switching valve to which a downstream side end of the storage liquid supply pipe, an upstream side end of the flow pipe, and an upstream side end of the liquid-sending pipe are flowingly connected,
wherein the controller includes a flow passage switching controller that controls the flow passage switching valve so that switching is performed between a flowing state in which the processing liquid flows through the flow pipe and a liquid-sending state in which the processing liquid is sent to the liquid-sending pipe.

10. The substrate processing apparatus according to claim 9, wherein the hypoxic fluid supply pipe is flowingly connected to the flow pipe at a position on a more upstream side of the flow pipe than a position at which the oxygen concentration meter is interposed, and
the flow-rate-changing controller further controls the flow rate changing valve so that the hypoxic fluid is sent from the hypoxic fluid supply pipe to the flow pipe when the processing liquid is not flowing through the flow pipe.

11. The substrate processing apparatus according to claim 9, wherein the controller includes a flow passage switching controller that controllably switches the flow passage switching valve so that the processing liquid is sent to the liquid-sending pipe after the oxygen concentration meter detects that an oxygen concentration of the processing liquid is not more than a predetermined concentration in a flowing state in which the processing liquid is flows through the flow pipe.

12. The substrate processing apparatus according to claim 11, wherein, when the flow passage switching controller has switched the flow passage switching valve so that a processing liquid is sent to the liquid-sending pipe, the flow-rate-changing controller controls the flow rate changing valve so that the hypoxic fluid is supplied to the flow pipe, and drains the processing liquid remaining in the flow pipe from the flow pipe.

13. A processing liquid draining method in a substrate processing apparatus,
the substrate processing apparatus comprising:
a processing portion that has a processing liquid supply nozzle and that supplies a processing liquid from the processing liquid supply nozzle to a substrate to process the substrate;
a storage portion that stores the processing liquid supplied from a processing liquid supply source;
a liquid-sending pipe that sends the processing liquid stored in the storage portion to the processing liquid supply nozzle;
a flow pipe that forms a flow passage different from the liquid-sending pipe and that allows the processing liquid to flow through the flow passage;
an oxygen concentration meter that is interposed in the flow pipe and that measures a concentration of oxygen dissolved in the processing liquid flowing through the flow pipe; and
a hypoxic fluid supply pipe that is in communication with the flow pipe and that sends a hypoxic fluid supplied from a hypoxic fluid supply source to the flow pipe,
the processing liquid draining method comprising:
a hypoxic fluid supply step of sending a hypoxic fluid supplied from the hypoxic fluid supply source from the hypoxic fluid supply pipe to the flow pipe; and
a processing liquid drainage step of draining the processing liquid remaining in the flow pipe from the flow pipe and replacing an inside of the flow pipe with a hypoxic fluid by use of the hypoxic fluid.

14. The processing liquid draining method in the substrate processing apparatus according to claim 13, wherein the flow pipe forms a circulated path that circulates a processing liquid stored in the storage portion inside the flow pipe by flowingly connecting one end of the flow pipe to a sending opening that is provided in the storage portion and from which a processing liquid is sent and by flowingly connecting an opposite end of the flow pipe to a return opening that is provided in the storage portion and to which a processing liquid returns,
the processing liquid draining method further comprising a hypoxic fluid maintaining step of, after the processing liquid drainage step, supplying a hypoxic fluid sent from the hypoxic fluid supply source to the storage portion and to the inside of the flow pipe and maintaining a hypoxic state by filling the storage portion and the inside of the flow pipe with the hypoxic fluid.

15. The processing liquid draining method in the substrate processing apparatus according to claim 13,
the substrate processing apparatus further comprising:
a storage liquid supply pipe that sends the processing liquid stored in the storage portion to a downstream side; and
a flow passage switching valve to which a downstream side end of the storage liquid supply pipe, an upstream side end of the flow pipe, and an upstream side end of the liquid-sending pipe are flowingly connected,
the hypoxic fluid supply pipe being flowingly connected to the flow pipe at a position on a more upstream side than a position of the flow pipe at which the oxygen concentration meter is interposed,
the processing liquid draining method further comprising:
a hypoxic fluid maintaining step of, after the processing liquid drainage step, supplying a hypoxic fluid sent from the hypoxic fluid supply source to the hypoxic fluid supply pipe and to the flow pipe and maintaining a hypoxic state by filling the hypoxic fluid supply pipe and the inside of the flow pipe with the hypoxic fluid.

16. A processing liquid replacing method in a substrate processing apparatus, the substrate processing apparatus comprising:
a processing portion that has a processing liquid supply nozzle and that supplies a processing liquid from the processing liquid supply nozzle to a substrate to process the substrate;
a storage portion that stores the processing liquid supplied from a processing liquid supply source;
a liquid-sending pipe that sends the processing liquid stored in the storage portion to the processing liquid supply nozzle;
a flow pipe that forms a flow passage different from the liquid-sending pipe and that allows the processing liquid to flow through the flow passage;
an oxygen concentration meter that is interposed in the flow pipe and that measures a concentration of oxygen dissolved in the processing liquid flowing through the flow pipe;
a hypoxic fluid supply pipe that is in communication with the flow pipe and that sends a hypoxic fluid supplied from a hypoxic fluid supply source to the flow pipe; and
a drainage pipe that is flowingly connected to the storage portion and that drains the processing liquid stored in the storage portion,
the processing liquid replacing method comprising:
a drainage step of draining a processing liquid stored in the storage portion from the storage portion;
a hypoxic fluid supply step of, after starting the drainage step, sending a hypoxic fluid supplied from the hypoxic fluid supply source from the hypoxic fluid supply pipe to the flow pipe in a state in which the processing liquid remains in the storage portion;
a processing liquid drainage step of draining the processing liquid remaining in the flow pipe from the flow pipe while filling an inside of the storage portion and an inside of the flow pipe with a hypoxic fluid by use of the hypoxic fluid; and
a new liquid supply step of, after the processing liquid drainage step, supplying a new processing liquid supplied from the processing liquid supply source to the storage portion and to the flow pipe in a state in which the inside of the storage portion and the inside of the flow pipe are filled with a hypoxic fluid.

17. The processing liquid replacing method in the substrate processing apparatus according to claim 16, the processing liquid replacing method further comprising:
a hypoxic-fluid-flow-rate increasing step of increasing a supply flow rate of the hypoxic fluid after a liquid surface of the processing liquid stored in the storage portion in the new liquid supply step becomes greater than a height of a supply port of the hypoxic fluid supply pipe flowingly connected so as to face the inside of the storage portion.

18. A substrate processing method in a substrate processing apparatus,
the substrate processing apparatus comprising:
a processing portion that has a processing liquid supply nozzle and that supplies a processing liquid from the processing liquid supply nozzle to a substrate to process the substrate;
a storage portion that stores the processing liquid supplied from a processing liquid supply source;
a liquid-sending pipe that sends the processing liquid stored in the storage portion to the processing liquid supply nozzle;
a flow pipe that forms a flow passage different from the liquid-sending pipe and that allows the processing liquid to flow through the flow passage;
an oxygen concentration meter that is interposed in the flow pipe and that measures a concentration of oxygen dissolved in the processing liquid flowing through the flow pipe;
a hypoxic fluid supply pipe that is in communication with the flow pipe and that sends a hypoxic fluid supplied from a hypoxic fluid supply source to the flow pipe;
a flow rate changing valve that is interposed in the hypoxic fluid supply pipe and that changes a supply flow rate of the hypoxic fluid to the flow pipe;
a storage liquid supply pipe that sends a processing liquid stored in the storage portion to a downstream side; and
a flow passage switching valve to which a downstream side end of the storage liquid supply pipe, an upstream side end of the flow pipe, and an upstream side end of the liquid-sending pipe are flowingly connected,
the hypoxic fluid supply pipe flowingly connected to the flow pipe at a position on a more upstream side of the flow pipe than a position at which the oxygen concentration meter is interposed,
the substrate processing method comprising:
a processing liquid flowing step of switching the flow passage switching valve and causing the processing liquid to flow through the flow pipe;
an oxygen concentration measurement step of measuring an oxygen concentration of the processing liquid flowing through the flow pipe by the oxygen concentration meter;
a processing liquid sending step of sending the processing liquid to the liquid-sending pipe by switching the flow passage switching valve and sending the processing liquid to the processing supply nozzle when an oxygen concentration of the processing liquid of the flow pipe is not more than a predetermined concentration in the oxygen concentration measurement step; and
a hypoxic fluid supply step of supplying the hypoxic fluid from the hypoxic fluid supply pipe to the flow pipe by increasing an opening degree of the flow rate changing valve so as to fill an inside of the flow pipe with a hypoxic fluid,
the hypoxic fluid supplying step performed in parallel with the processing liquid sending step.

* * * * *